(12) United States Patent
Santos Rodriguez

(10) Patent No.: US 10,796,914 B2
(45) Date of Patent: Oct. 6, 2020

(54) METHOD FOR PROCESSING A WAFER, AND LAYER STACK

(71) Applicant: Infineon Technologies AG, Neubiberg (DE)

(72) Inventor: Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/648,546

(22) Filed: Jul. 13, 2017

(65) Prior Publication Data

US 2018/0019127 A1   Jan. 18, 2018

(30) Foreign Application Priority Data

Jul. 14, 2016   (DE) .......................... 10 2016 112 976

(51) Int. Cl.
  *H01L 21/308*   (2006.01)
  *H01L 21/20*   (2006.01)
  (Continued)

(52) U.S. Cl.
  CPC ............ *H01L 21/2007* (2013.01); *C25D 5/08* (2013.01); *H01L 21/02002* (2013.01); *H01L 21/02019* (2013.01); *H01L 21/304* (2013.01); *H01L 21/67023* (2013.01); *H01L 21/3065* (2013.01); *H01L 21/30604* (2013.01);
  (Continued)

(58) Field of Classification Search
  CPC .......................... H01L 21/308; B81C 1/00865
  See application file for complete search history.

(56) References Cited

U.S. PATENT DOCUMENTS

| 5,904,546 A | * | 5/1999 | Wood ...................... H01L 21/78 |
| | | | 257/E21.599 |
| 6,261,969 B1 | | 7/2001 | Matsuno et al. |
| | | | (Continued) |

FOREIGN PATENT DOCUMENTS

| CN | 1132223 C | 12/2003 |
| CN | 102804334 A | 11/2012 |
| | (Continued) | |

OTHER PUBLICATIONS

Volker Lehmann, "Electrochemistry of Silicon: Instrumentation, Science, Materials and Applications", 2002, Wiley-VCH Verlag GmbH.
(Continued)

*Primary Examiner* — Thomas T Pham
(74) *Attorney, Agent, or Firm* — Viering, Jentschura & Partner MBB

(57) ABSTRACT

In various embodiments, a method for processing a wafer is provided. The method includes forming a layer stack, including a support layer and a useful layer and a sacrificial region between them, said sacrificial region having, vis-à-vis a processing fluid, a lower mechanical and/or chemical resistance than the support layer and than the useful layer. The support layer has a depression, which exposes the sacrificial region. The method further includes forming at least one channel in the exposed sacrificial region by means of the processing fluid. The channel connects the depression to an exterior of the layer stack.

21 Claims, 11 Drawing Sheets

(51) Int. Cl.
*H01L 21/02* (2006.01)
*C25D 5/08* (2006.01)
*H01L 21/304* (2006.01)
*H01L 21/67* (2006.01)
*H01L 21/311* (2006.01)
*H01L 21/306* (2006.01)
*H01L 29/739* (2006.01)
*H01L 21/3065* (2006.01)

(52) U.S. Cl.
CPC .... *H01L 21/31111* (2013.01); *H01L 21/31116* (2013.01); *H01L 29/7395* (2013.01); *H01L 29/7397* (2013.01)

(56) References Cited

U.S. PATENT DOCUMENTS

| | | | | |
|---|---|---|---|---|
| 6,444,541 | B1* | 9/2002 | Lai | H01L 21/76232 257/E21.549 |
| 2001/0019153 | A1 | 9/2001 | Sato et al. | |
| 2005/0250295 | A1 | 11/2005 | Mita | |
| 2008/0079461 | A1* | 4/2008 | Lin | H01L 21/76816 326/80 |
| 2008/0094690 | A1* | 4/2008 | Luo | G02B 26/001 359/318 |
| 2011/0260296 | A1 | 10/2011 | Bieck et al. | |
| 2012/0068311 | A1 | 3/2012 | Yamazaki | |
| 2015/0168824 | A1* | 6/2015 | Sun | G03F 1/64 430/5 |
| 2016/0190010 | A1 | 6/2016 | Priewasser | |

FOREIGN PATENT DOCUMENTS

| | | |
|---|---|---|
| CN | 105742212 A | 7/2016 |
| DE | 19654791 A | 9/1997 |
| EP | 2629322 A2 | 8/2013 |
| JP | 2004281551 A | 10/2004 |
| JP | 2008218820 A | 9/2008 |
| WO | 2009141811 A2 | 11/2009 |

OTHER PUBLICATIONS

Kiyofumi Sakaguchi et al., "Extremely High Selective Etching of Porous Si for Single Etch-Stop Bond-and-Etch-Back Silicon-on-Insulator", Japanese Journal of Applied Physics, Feb. 1995, pp. 842-847, vol. 34, Part 1, No. 2B, The Japan Society of Applied Physics.
Takao Yonehara et al., "ELTRAN ; Novel SOI Wafer Technology", JSAP International, Jul. 2001, pp. 10-16, No. 4.
Chinese Search Report based on Application No. 201710576639.8, dated Mar. 14, 2020, 2 pages (for reference purpose only).
Chinese Office Action based on Application No. 201710576639.8, dated Mar. 19, 2020, 18 pages (10 pages English Translation + 8 pages Original) (for refrence purpose only).

* cited by examiner

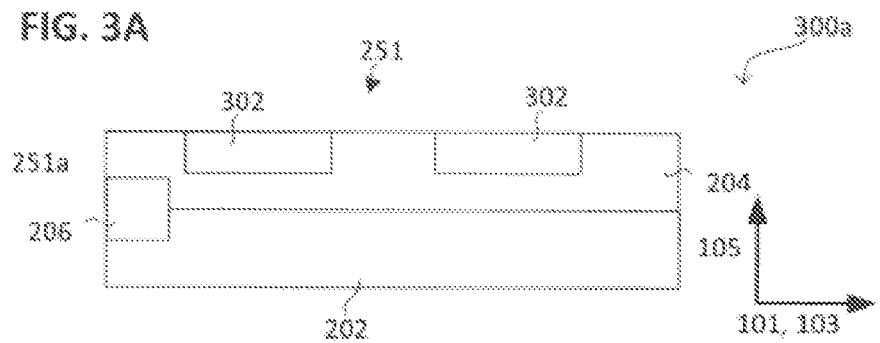
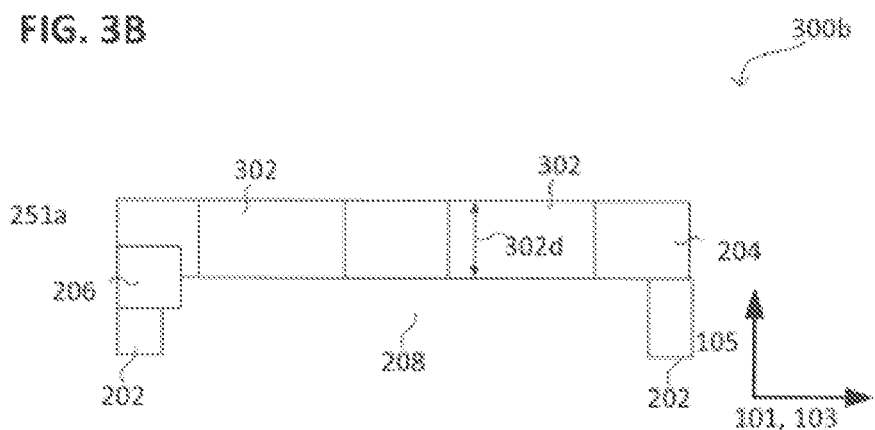
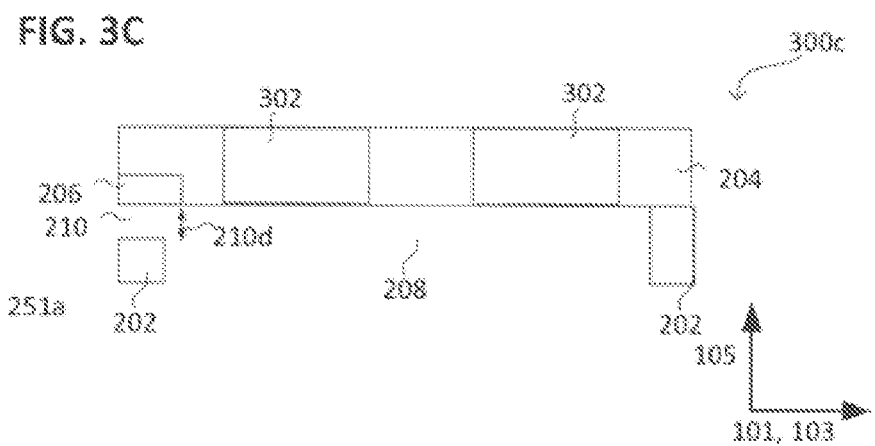

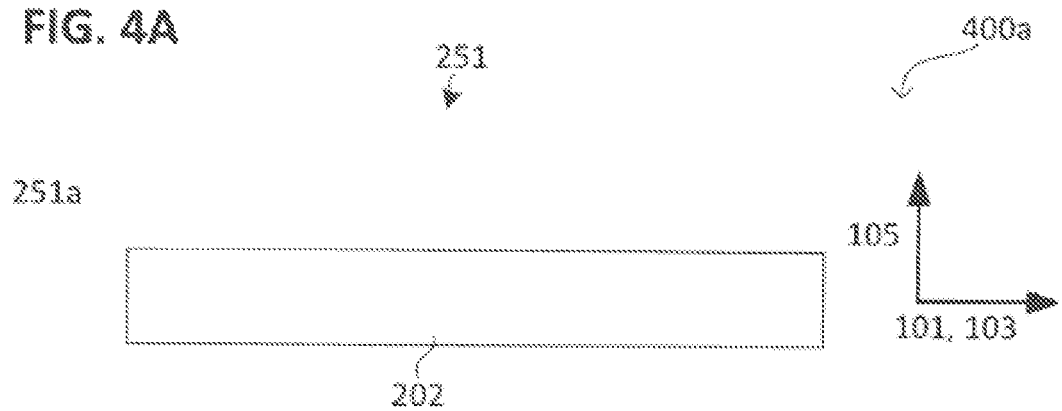
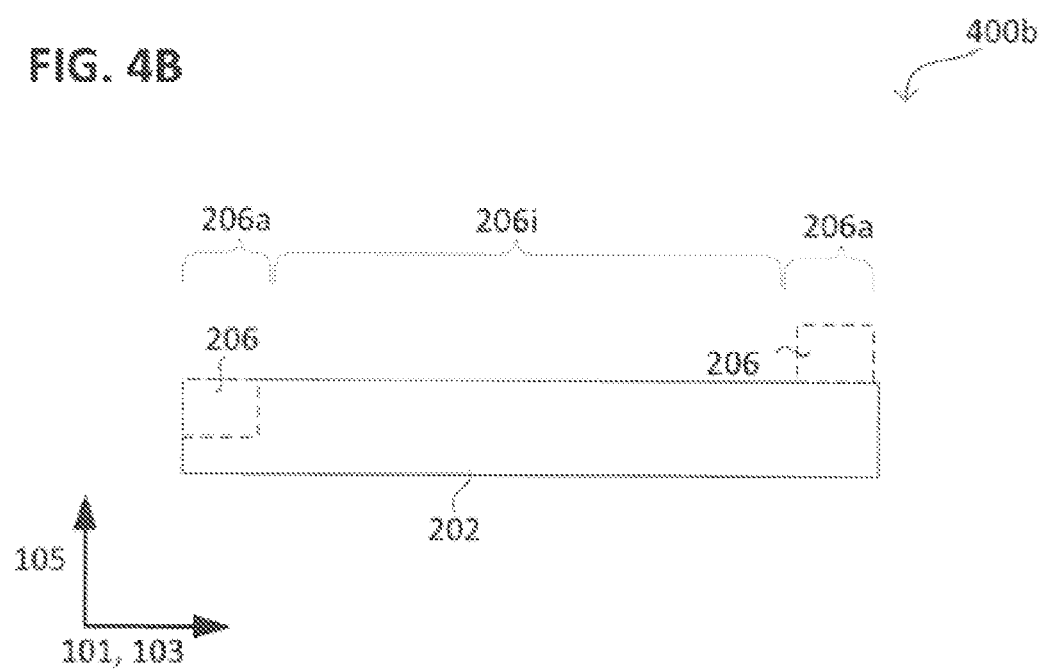
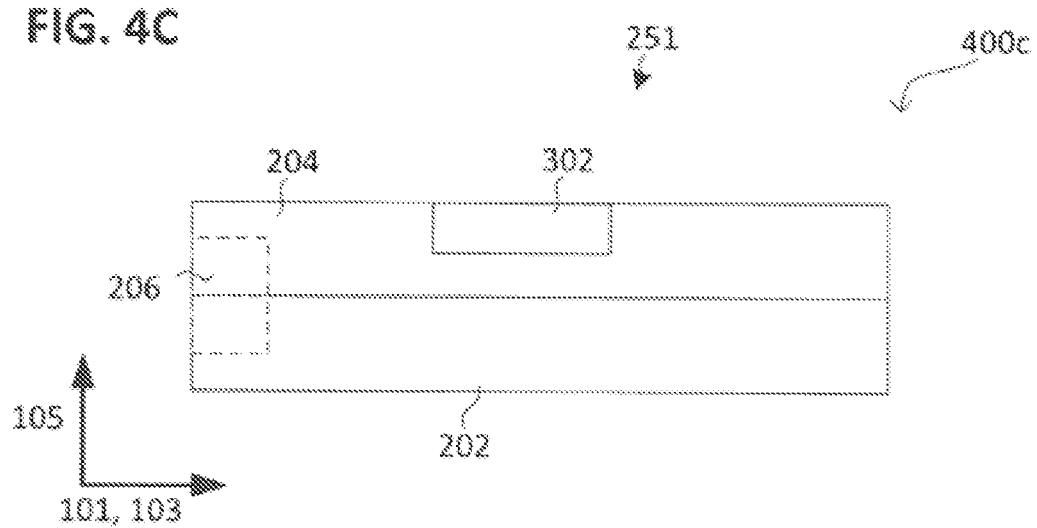

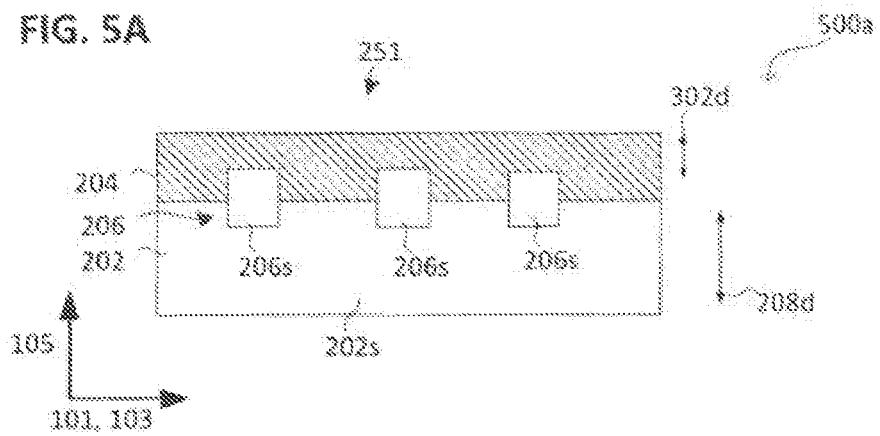
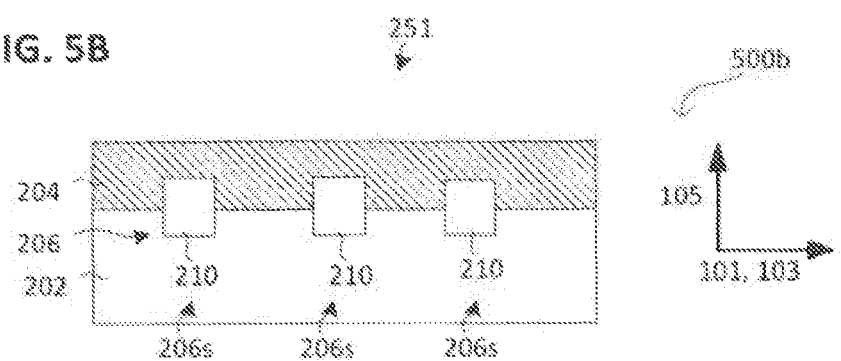
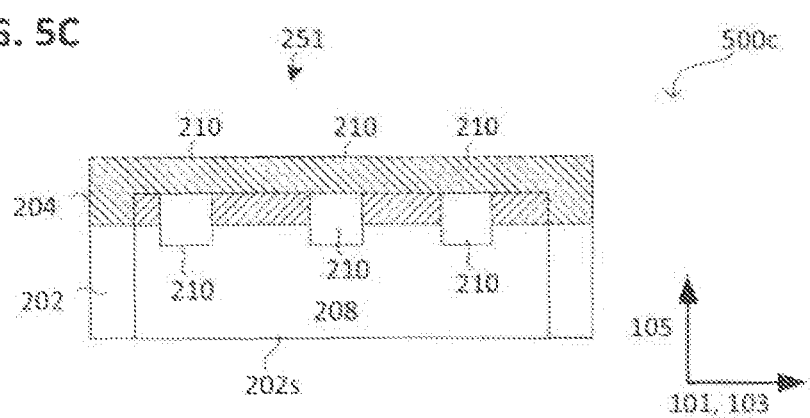

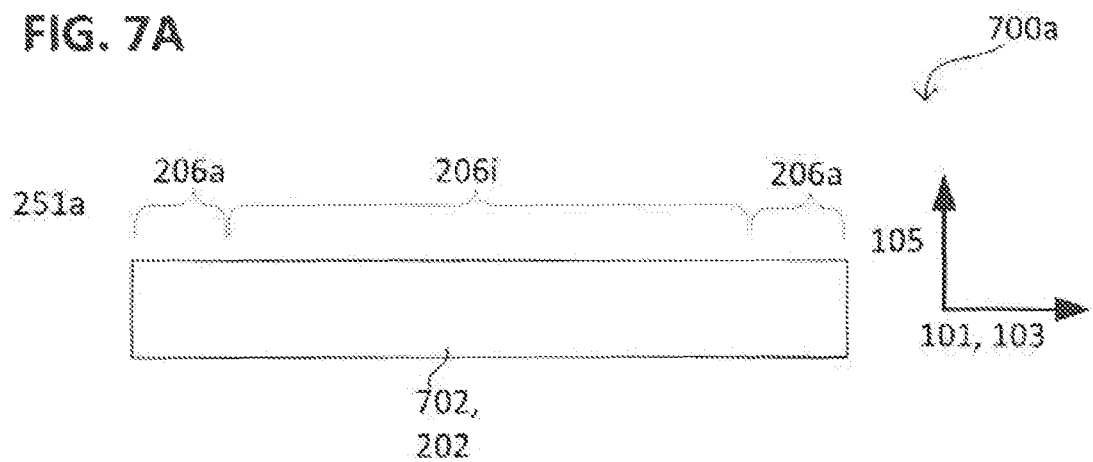
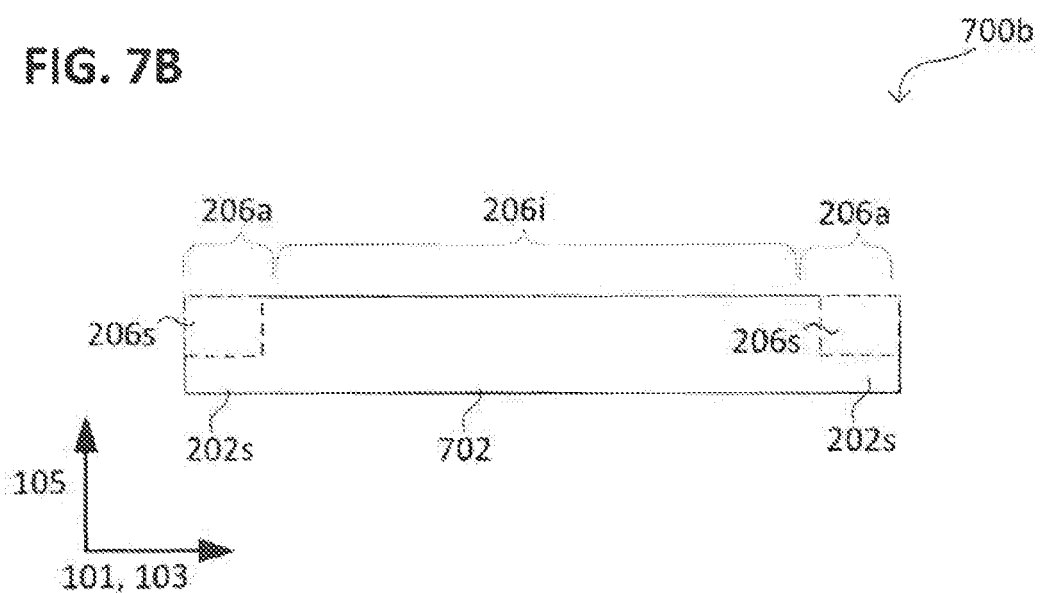
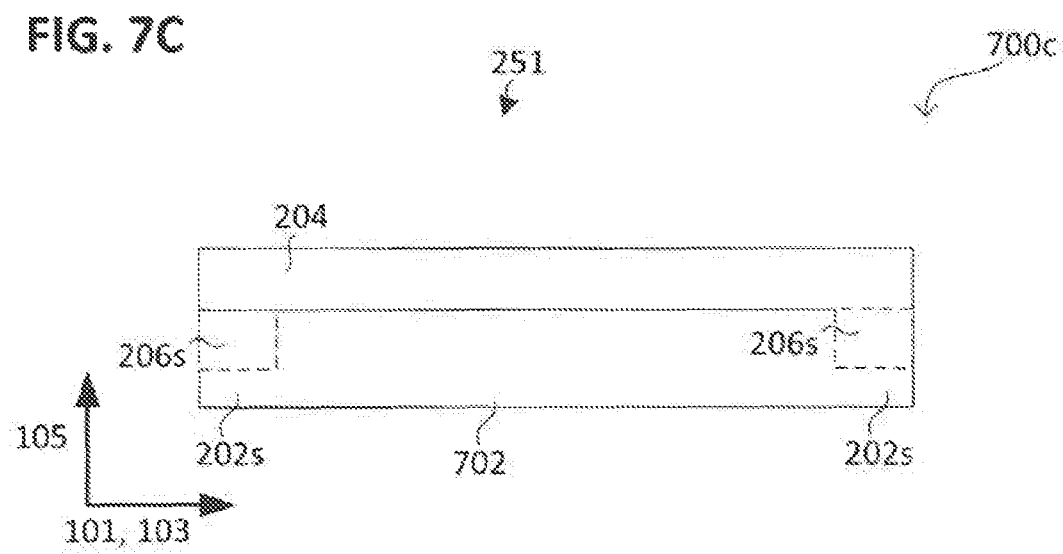

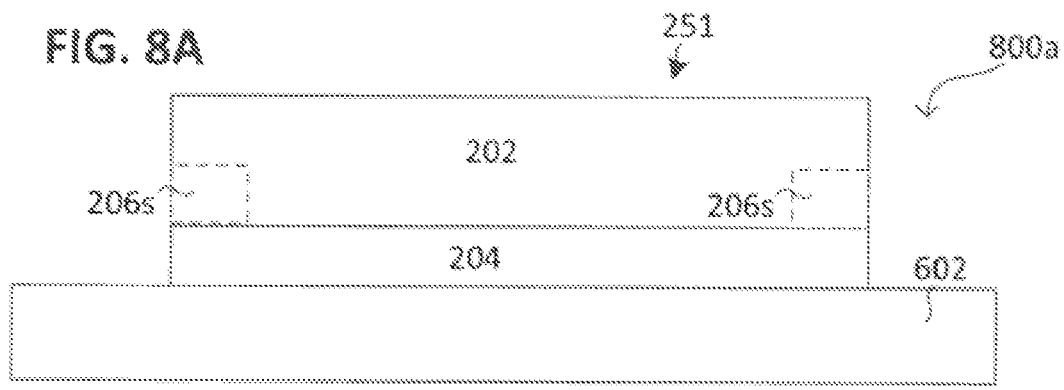
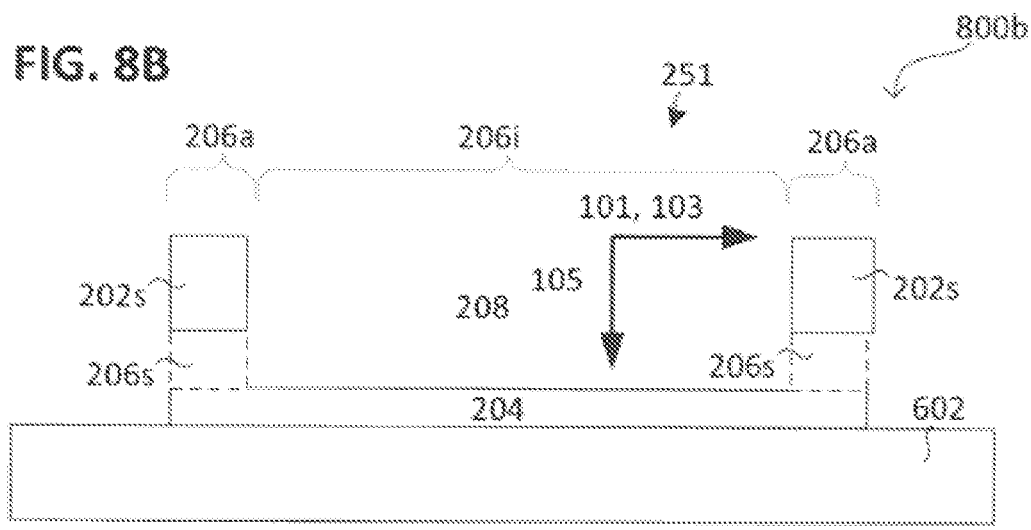
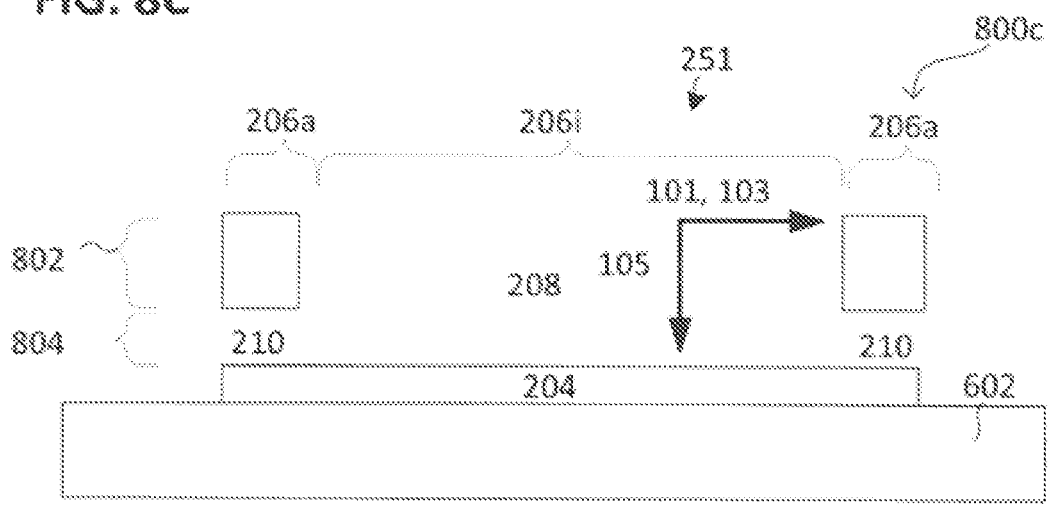

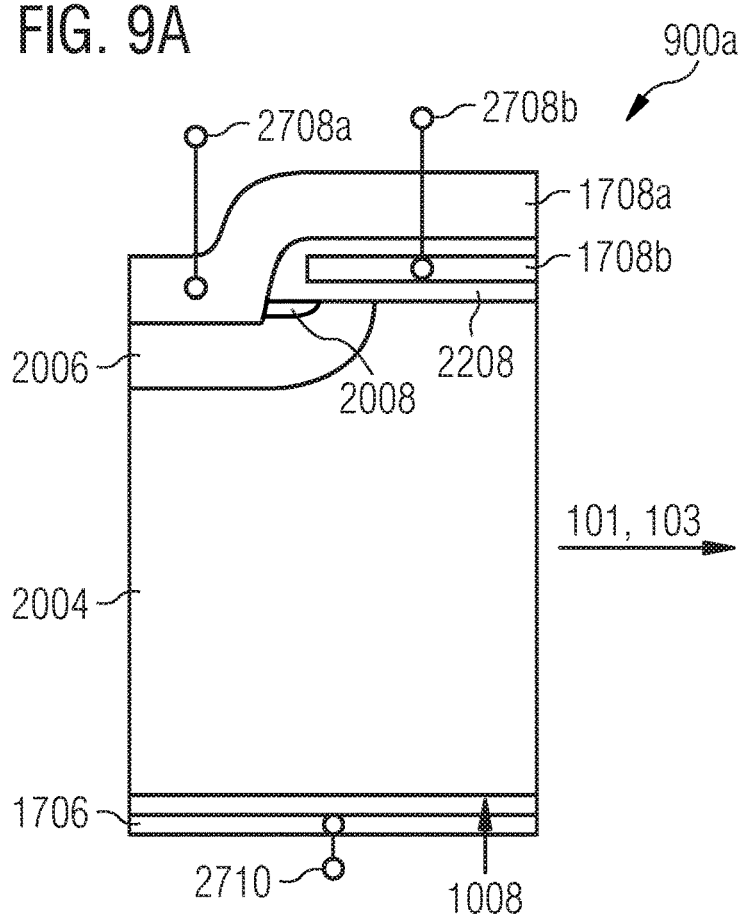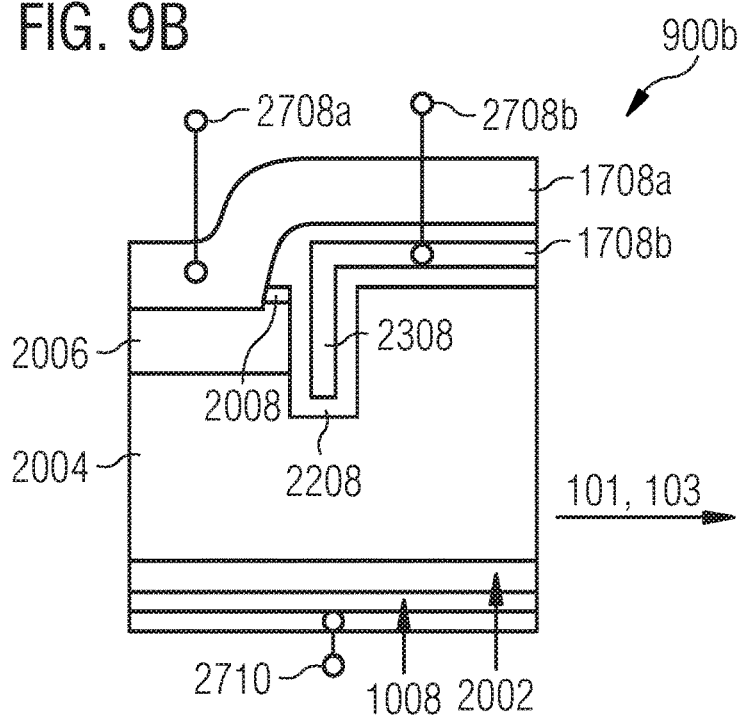

METHOD FOR PROCESSING A WAFER, AND LAYER STACK

CROSS-REFERENCE TO RELATED APPLICATION

This application claims priority to German Patent Application Serial No. 10 2016 112 976.3, which was filed Jul. 14, 2016, and is incorporated herein by reference in its entirety.

TECHNICAL FIELD

Various embodiments relate generally to a method for processing a wafer, and to a layer stack.

BACKGROUND

In general, it is possible to process, singulate and embed a semiconductor chip (also referred to as integrated circuit, IC, chip or microchip) using semiconductor technology on and/or in a wafer (or a substrate or a carrier). A finished produced chip (e.g. an embedded integrated circuit) can be mounted in or on a carrier and contacted in order to provide a specific functionality, such as e.g. the switching of electric currents. In order to reduce resistive losses of the chip, which reduces the power consumption thereof particularly in the case of high electric currents, the chip overall can be produced so as to be as thin as possible, such that a vertical current path through the chip is as short as possible. In order to produce such chips on an epitaxial layer basis, correspondingly thin wafers are required, e.g. for producing insulated-gate bipolar transistors (also referred to as IGBT) or emitter controlled diodes (also referred to as Emcon diode).

The processing of correspondingly thin wafers can constitute a particular challenge since said wafers are very sensitive. It is conventional practice, therefore, to mechanically stiffen a wafer in order to counteract damage to the wafer as a result of the deformation thereof. For stiffening purposes, when thinning the wafer to the desired thickness, the edge 102 of the wafer (e.g. also referred to as rear-side support ring 102) is left intact, which surrounds the thinned region 104 of the wafer 100a, as is shown in a schematic cross-sectional view in FIG. 1A and in a side view in FIG. 1B.

However, the support ring 102 can also act as a mechanical barrier to liquids which are intended to act on the thinned region 104, and can thus make the processing of the wafer more difficult. By way of example, particularly stringent requirements made of the maximum thickness variation that can be tolerated (called "total thickness variation", TTV) can necessitate the processing of the wafer by means of a liquid.

In particular, spin processes such as e.g. resist coating, development, cleaning processes or etches can be impaired, etching liquid used (e.g. for relaxing the wafer) can be impeded and turbulences in the etching liquid and/or fluctuations of the resulting etching rate can thus be promoted. As a result, the material of the wafer can be removed inhomogeneously, e.g. in comparison with thinning methods without a support ring 102. However, the control of the resulting wafer thickness and the spatial distribution thereof can be a key parameter in the production of power chips which illustratively have stringent requirements made of the length of the current path through the respective chip and thus the maximum thickness variation that can be tolerated (TTV).

In order to reduce the barrier effect brought about by the support ring 102, slots 106 are conventionally sawn into the support ring 102, through which slots the etching liquid can flow away better. However, this involves accepting the fact that the stiffening effect of the support ring 102 is greatly reduced. Likewise, a high risk of damage to components already fabricated in the wafer is accepted, e.g. as a result of the mechanical loading that arises during sawing.

Therefore, sawing permits only a small latitude in the process variation, since an additional stabilization of the wafer can become necessary or sensitive parts of the components can be fabricated only after sawing and/or must be protected. By way of example, additional protection measures, such as films, become necessary in order to protect sensitive surfaces of the wafer during thinning.

Furthermore, the shape of the saw blade increases the amount of material that has to be removed from the wafer in order to effectively reduce the barrier effect. Illustratively, a more greatly curved saw blade requires a deeper cut into the wafer. As a result, the stiffening effect of the support ring is reduced even further and the distance between the chips and the support ring should be greater in order to prevent sawing into the chips. Likewise, as a result, sawing may be limited to a specific wafer size or may reduce the usable wafer area.

SUMMARY

In various embodiments, a method for processing a wafer is provided. The method includes forming a layer stack, including a support layer and a useful layer and a sacrificial region between them, said sacrificial region having, vis-à-vis a processing fluid, a lower mechanical and/or chemical resistance than the support layer and than the useful layer. The support layer has a depression, which exposes the sacrificial region. The method further includes forming at least one channel in the exposed sacrificial region by means of the processing fluid. The channel connects the depression to an exterior of the layer stack.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3C in each case show a method in accordance with various embodiments in a schematic cross-sectional view;

FIGS. 4A to 4C in each case show a method in accordance with various embodiments in a schematic side view or cross-sectional view;

FIGS. 5A to 5C in each case show a method in accordance with various embodiments in a schematic cross-sectional view;

FIGS. 7A to 7C in each case show a method in accordance with various embodiments in a schematic cross-sectional view;

FIGS. 8A to 8C in each case show a method in accordance with various embodiments in a schematic cross-sectional view;

FIG. 9A, FIG. 9B and FIG. 10 in each case show a circuit element in accordance with various embodiments in a schematic cross-sectional view.

DESCRIPTION

Figure 1A:
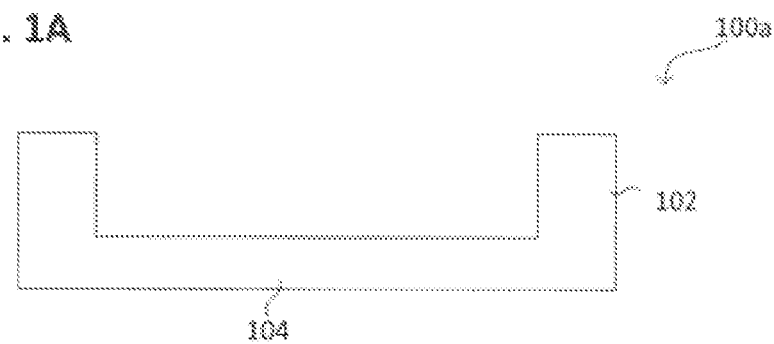
FIGS. 1A to 1C show a conventional method.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

The term "exemplary" is used here with the meaning "serving as an example, exemplar or illustration". Any embodiment or configuration that is described here as "exemplary" should not necessarily be understood as preferred or advantageous vis-à-vis other embodiments or configurations.

The term "above" with respect to deposited material that is formed "above" a side or surface can be understood in accordance with various embodiments to mean that the deposited material is formed "directly on", e.g. in direct (e.g. physical) contact with, the stated side or surface. The term "above" with respect to a deposited material that is formed "above" a side or surface can be understood in accordance with various embodiments to mean that the deposited material is formed "indirectly on" the stated side or surface, wherein one or a plurality of additional layers are arranged between the stated side or surface and the deposited material.

The term "lateral" or "laterally" with respect to the "lateral" extent of a structure (or of a substrate, a wafer or a carrier) or "laterally" adjoining can be used in accordance with various embodiments to denote an extent or a positional relationship along a surface of a substrate, a wafer or a carrier. That means that a surface of a substrate (for example a surface of a carrier or a surface of a wafer) can serve as a reference which is generally designated as the main processing surface of the substrate (or the main processing surface of the carrier or of the wafer). Furthermore, the term "width", which is used with regard to a "width" of a structure (or of a structure element) can be used here to denote the lateral extent of a structure.

Furthermore, the term "height", which is used with respect to a height of a structure (or of a structure element), can be used here to denote the extent of a structure along a direction perpendicular to the surface of a substrate (e.g. perpendicular to the main processing surface of a substrate), i.e. a vertical extent. The term "thickness", which is used with regard to a "thickness" of a layer, can be used here to denote the spatial extent of the layer perpendicular to the surface of the carrier (of the material) on which the layer is deposited, i.e. a vertical extent. If the surface of the carrier is parallel to the surface of the substrate (for example to the main processing surface), the thickness of the layer applied on the carrier can be equal to the height of the layer. Furthermore, a "vertical" structure can denote a structure which extends in a direction perpendicular to the lateral direction (e.g. perpendicular to the main processing surface of a substrate), and a "vertical" extent can denote an extent along a direction perpendicular to a lateral direction (for example an extent perpendicular to the main processing surface of a substrate).

In the context of this description, the terms "connected" and "coupled" are used to describe both a direct and an indirect connection and a direct or indirect coupling, e.g. in an electrically conductive manner. In the figures, identical or similar elements are provided with identical reference signs, insofar as this is expedient.

In accordance with various embodiments, the term "fluid" can be understood as including or formed from a liquid material and/or a gaseous material. The gaseous material can optionally be at least partly ionized. In other words, the gaseous material can optionally include or be formed from a plasma.

In accordance with various embodiments, a chip can be formed as a thin chip or as a very thin chip. A thin chip can have a thickness in the range of approximately 70 µm to approximately 250 µm. A very thin chip can have a thickness in the range of approximately 5 µm to approximately 70 µm. The chip can optionally be thicker than a thin chip, e.g. in a range of approximately 250 µm to approximately 1 mm (millimeter).

In accordance with various embodiments, a chip can have and/or provide a vertical current path (i.e. a current path through the chip), e.g. between two contact pads arranged on opposite sides of the chip (e.g. on the rear side thereof and the front side thereof).

In accordance with various embodiments, a useful layer can be understood as a layer which is processed for producing individual components, i.e. electrical circuit elements and/or integrated circuits. By way of example, the useful layer can be chemically altered, coated and/or structured at least in sections. The useful layer including at least one component can also be referred to as component layer. The useful layer may include or be formed from a semiconductor region.

In accordance with various embodiments, a semiconductor region (e.g. of the useful layer) can be processed in order to form one or a plurality of electrical circuit elements, e.g. individually or interconnected with one another. A plurality of circuit elements interconnected with one another can form an integrated circuit, for example. In general, one chip (also referred to as semiconductor chip) or a plurality of chips can be formed in the semiconductor region.

Each or the chip may include an active chip area. The active chip area can be arranged in a part of the semiconductor region and may include at least one circuit element (one circuit element or a plurality of circuit elements), such as a transistor, a resistor, a capacitor, a diode or the like. The at least one circuit element can be configured for performing operations, e.g. computation operations or storage operations. Alternatively or additionally, the at least one circuit element can be configured for performing switching operations or amplification operations, e.g. in power electronics (e.g. using power circuit elements).

Various circuit elements, such as e.g. a transistor and/or a diode, can be configured for high-voltage applications (also referred to as high-voltage diode or high-voltage transistor). Alternatively or additionally, various circuit elements, such as e.g. a transistor and/or a diode, can be emitter controlled (also referred to as EMCON).

In accordance with various embodiments, a chip (also referred to as an integrated circuit) can be singulated from the semiconductor region by material being removed from a kerf of the semiconductor region (also referred to as dividing or cutting apart the semiconductor region). By way of example, material can be removed from the kerf of the semiconductor region by scribing and breaking, splitting, blade dividing (separation), plasma dividing (separation), laser dividing or mechanical sawing (for example by using a separating saw). After the semiconductor chip has been singulated, it can be electrically contacted and subsequently encapsulated (e.g. in a closed or half-open fashion), e.g. by means of a molding material and/or into a chip carrier (also referred to as chip package) suitable for use in an electronic device. By way of example, the chip can be connected by means of wires within the chip carrier and/or the chip carrier can be soldered on a printed circuit board and/or on a leadframe (for example an IGBT or a power MOSFET).

In accordance with various embodiments, the sacrificial region, the useful layer and/or the support layer may include or be formed from one of the semiconductor materials below. The term semiconductor material can be understood as a chemical composition which includes or is formed from a semiconducting base material and/or is semiconducting in an undoped state, i.e. has an electrical conductivity in a range of approximately $10^{-6}$ siemens/meter to approximately $10^6$ siemens/meter. During the processing of the wafer, the semiconducting base material can be doped for example in sections, which increases its electrical conductivity in the doped locations (e.g. above $10^6$ siemens/meter).

In accordance with various embodiments, a method and a layer stack are provided which reduce a mechanical barrier effect of the rear-side support ring (e.g. on liquids, i.e. fluids, e.g. on an etching liquid) without impairing the stiffening effect of the support ring (e.g. a Taiko ring). What can thus be achieved is that the processing of the thinned region by means of liquids is facilitated. By way of example, the processing of the thinned region by means of a liquid may include: resist coating, lithography, development, cleaning and/or etching.

In general, a support ring can be provided, e.g. a rear-side support ring (rear-side ring). By way of example, the front side of the wafer can be processed by means of initial processes (e.g. back-end processes or front-end processes) and the rear side of the wafer can be processed by means of end processes. In general, the support ring can be formed by means of a subtractive (separating) process, e.g. by means of chemical erosion (e.g. etching), by means of electrochemical erosion (e.g. eroding), by means of thermal erosion (e.g. plasma etching or laser ablation), and/or by means of mechanical separation (e.g. machining, such as grinding). In the case where the support ring is formed by means of grinding the wafer, it can also be referred to as a Taiko ring.

In accordance with various embodiments, the processing of the support ring (e.g. a Taiko ring) can be carried out more gently in order to reduce the barrier effect caused by the latter. Thus, additional protection measures can be dispensed with and more freedoms are provided in the process configuration. Illustratively, the processing of the wafer is facilitated. Furthermore, the risk of damage to components can be reduced.

In accordance with various embodiments, a method for processing a wafer may include the following: forming a layer stack, including a support layer and a useful layer and also a sacrificial region between them, said sacrificial region having, vis-à-vis a processing fluid, a lower mechanical and/or chemical resistance than the support layer and than the useful layer; forming a depression through the support layer or at least into the latter, which depression exposes the sacrificial region; forming at least one channel in the exposed sacrificial region (i.e. after the sacrificial region has been exposed) by means of the processing fluid, wherein the channel connects the depression to an exterior of the layer stack.

In accordance with various embodiments, a method for processing a wafer may include the following: forming a layer stack, including a support layer and a useful layer and also a sacrificial region between them, said sacrificial region having, vis-à-vis a processing fluid, a lower mechanical and/or chemical resistance than the support layer and than the useful layer; wherein the support layer has a depression, which exposes the sacrificial region; forming at least one channel in the exposed sacrificial region (i.e. after the sacrificial region has been exposed) by means of the processing fluid, wherein the channel connects the depression to an exterior of the layer stack (i.e. forms a connection through the support layer).

In accordance with various embodiments, the depression can be formed through the support layer or at least into the latter by virtue of material being removed from the support layer (e.g. by means of thermal evaporation, chemical processing and/or mechanical processing) or by virtue of material being deposited by means of a mask.

In accordance with various embodiments, a method for processing a wafer may include the following: forming a layer stack, including a support layer and a useful layer and also a sacrificial region between them, said sacrificial region having, vis-à-vis a processing fluid, a lower mechanical and/or chemical resistance than the support layer and than the useful layer; exposing the sacrificial region by means of a depression formed through the support layer or at least into the latter; and connecting the depression to an exterior of the layer stack by means of a channel formed by virtue of material being removed from the sacrificial region by means of the processing fluid.

In accordance with various embodiments, the useful layer may include at least one electrical circuit element (i.e. one electrical circuit element or a plurality of electrical circuit elements) (e.g. at least one semiconductor component).

In accordance with various embodiments, the support layer may include the wafer; or the useful layer can be arranged between the support layer and the wafer.

In accordance with various embodiments, the useful layer and the support layer and/or the useful layer and the sacrificial region can have an epitaxial relation to one another.

The semiconductor material or the semiconducting base material may include or be formed from, for example, an elemental semiconductor (e.g. silicon or germanium) or a compound semiconductor (e.g. silicon carbide or SiGe).

In accordance with various embodiments, the sacrificial region can have a greater dopant concentration than the support layer and/or than the useful layer, e.g. if the support layer and/or if the useful layer (e.g. the base material thereof) include (s) or are/is formed from silicon carbide (SiC).

In accordance with various embodiments, the sacrificial region can have a greater impurity concentration than the support layer and/or than the useful layer, e.g. if the support layer and/or the useful layer (e.g. the base material thereof) include (s) or are/is formed from silicon (Si) and/or germanium (Ge). By way of example, the sacrificial region can then include or be formed from SiGe, e.g. with a higher concentration of silicon than the support layer and/or than the useful layer (e.g. if the support layer and/or the useful layer substantially include (s) or are/is formed from germanium) or with a higher concentration of germanium than the support layer and/or than the useful layer (e.g. if the support layer and/or the useful layer substantially include(s) or are/is formed from silicon).

In accordance with various embodiments, a substrate (e.g. a wafer, e.g. a reconfigured wafer) and/or a semiconductor region may include or be formed from a semiconductor material (e.g. the base material) of one type or of different types, including group IV semiconductors (e.g. silicon or germanium), compound semiconductors, e.g. group III-V compound semiconductors (for example gallium arsenide), group III semiconductors, group V semiconductors or semiconducting polymers. In a plurality of embodiments, the substrate and/or the semiconductor region can be formed from silicon (doped or undoped). In a plurality of alternative embodiments, the substrate and/or the semiconductor region can be a silicon-on-insulator (SOI) wafer. As an alternative, it is possible to use any other suitable semiconductor material for the substrate and/or the semiconductor region, for example a semiconductor compound (semiconducting chemical compound) such as gallium phosphide (GaP), indium phosphide (InP), silicon carbide (SiC) or gallium nitride (GaN), but also any suitable ternary semiconductor compound or quaternary semiconductor compound, such as indium gallium arsenide (InGaAs), for example.

In accordance with various embodiments, the useful layer can be grown epitaxially onto the support layer and the sacrificial region.

In accordance with various embodiments, the sacrificial region can be formed by virtue of a section of the support layer and/or of the useful layer being chemically and/or structurally altered.

In accordance with various embodiments, the sacrificial region can be formed by virtue of a material (sacrificial material) being deposited on the support layer. Optionally, the sacrificial material can be doped and/or the sacrificial material can be oxidized. By way of example, a compound semiconductor can be deposited.

In accordance with various embodiments, the sacrificial region (or the sacrificial material thereof) may include or be formed from a compound semiconductor. The compound semiconductor may include or be formed from, for example, silicon-germanium (SiGe), e.g. including approximately 5 at. % to 95 at. % germanium, e.g. including approximately 10 at. % to 95 at. % germanium.

In accordance with various embodiments, the sacrificial region can be formed by virtue of a section of the support layer and/or useful layer being doped.

In accordance with various embodiments, the sacrificial region may include a plurality of segments which are at a distance from one another and each segment of which is exposed by the depression, wherein forming at least one channel in the sacrificial region includes forming at least one channel in each segment of the sacrificial region.

In accordance with various embodiments, the sacrificial region can be formed by virtue of a section of the support layer and/or of the useful layer being selectively etched.

In accordance with various embodiments, the sacrificial region can have a greater porosity than the support layer and/or than the useful layer.

In accordance with various embodiments, the sacrificial region can have a greater impurity concentration (e.g. dopant concentration) than the support layer and/or than the useful layer.

In accordance with various embodiments, the sacrificial region (or the sacrificial material thereof) and the support layer (or the material thereof) may include at least one shared chemical element (e.g. a semiconductor). The sacrificial region can optionally additionally include the impurity (e.g. in a higher concentration than the support layer) and/or have defects (e.g. in a higher density than the support layer). Alternatively or additionally, the sacrificial region and the useful layer may include at least one shared chemical element (e.g. a semiconductor). The sacrificial region can additionally include the impurity (e.g. in a higher impurity concentration than the useful layer). The sacrificial region can optionally additionally include the impurity (e.g. in a higher concentration than the useful layer) and/or have defects (e.g. in a higher density than the useful layer).

The at least one shared chemical element may include or be formed from e.g. one chemical element (e.g. an elemental semiconductor) or a plurality of chemical elements (e.g. a compound semiconductor formed therefrom). The at least one shared chemical element can also be referred to as basic material, e.g. if the support layer and/or the useful layer are/is formed from the at least one chemical element.

In accordance with various embodiments, the sacrificial region can differ from the support layer and/or the useful layer in terms of chemical composition.

In accordance with various embodiments, the depression can be formed in an inner section of the support layer, such that an outer section of the support layer surrounds the depression. The outer section of the support layer can illustratively form the support ring (also referred to as stiffening or stiffening ring).

In accordance with various embodiments, for forming the channel, the processing fluid can act on the layer stack (e.g. on the useful layer and/or on the support layer).

In accordance with various embodiments, the processing fluid may include an etching liquid, an etching gas and/or an etching plasma.

In accordance with various embodiments, the depression can extend along a first direction through the support layer or at least into the latter; and the channel can extend along a second direction through the sacrificial region; wherein the second direction can run transversely (i.e. perpendicularly) with respect to the first direction.

In accordance with various embodiments, the depression can expose part of the useful layer.

In accordance with various embodiments, forming the depression can be carried out before forming the at least one channel.

In accordance with various embodiments, the method can furthermore include: doping the useful layer through the depression (e.g. by means of implanting a dopant into the useful layer).

In accordance with various embodiments, the method can furthermore include: activating the dopant (e.g. by means of thermal energy).

In accordance with various embodiments, the method can furthermore include: masking the useful layer, i.e. forming a mask above the useful layer. The mask (etching mask) may include or be formed from a soft mask or a hard mask. A hard mask may include a durable material, e.g. more durable than the soft mask. The soft mask may include or be formed from, for example, a polymer or some other organic material. The mask may include or be formed from, for example, a resist (e.g. photoresist). By way of example, the hard mask can be durable to withstand oxygen, fluorine, chlorine and/or other reactive gases. The hard mask can be used for example for processing (e.g. structuring) by means of wet chemistry and/or plasma etching.

In accordance with various embodiments, the method can furthermore include: structuring the useful layer (e.g. by means of the mask). By way of example, a lithography process can be carried out using the mask.

In accordance with various embodiments, the method can furthermore include: electrically contacting the useful layer by means of a metallization formed in the depression.

In accordance with various embodiments, the method can furthermore include: securing the layer stack on a carrier before the depression is formed.

In accordance with various embodiments, a layer stack (e.g. including a wafer) may include the following: a support layer and a useful layer; a depression, which extends through the support layer or at least into the latter; at least one channel, which extends through between the support layer and the useful layer from the depression to an exterior of the layer stack.

In accordance with various embodiments, the useful layer may include at least one electrical circuit element.

In accordance with various embodiments, the channel can be delimited by the support layer and the useful layer on mutually opposite sides transversely (i.e. perpendicularly) with respect to the extension of the channel.

In accordance with various embodiments, the useful layer, the support layer and/or the sacrificial region may include or be formed from a semiconductor region.

In accordance with various embodiments, the depression can extend along a direction running transversely (i.e. perpendicularly) with respect to the extension of the channel (e.g. extending through the support layer or at least into the latter); wherein the channel is delimited by the support layer and the useful layer parallel to the direction on mutually opposite sides.

In accordance with various embodiments, the sacrificial region may include or be formed from an oxide (e.g. a semiconductor oxide such as silicon dioxide). Alternatively or additionally, the sacrificial region can be doped and/or porous. By way of example, the sacrificial region may include or be formed from doped and/or porous oxide or semiconductor material (e.g. silicon and/or silicon-germanium and/or SiC). The sacrificial region can optionally include or be formed from an epitaxial material.

In accordance with various embodiments, a channel can have a cross section (cut transversely with respect to a direction away from the depression) which increases or decreases in a direction away from the depression (e.g. in a funnel-shaped fashion). By way of example, the cross section (e.g. the width and/or height of the channel) can decrease in the direction away from the depression. It is thus possible to attain a large inlet region at the depression, which further reduces the barrier effect. Alternatively, the cross section (e.g. the width and/or height of the channel) can increase in the direction away from the depression. The largest possible cross section of the support ring can thus be maintained, which increases the stiffening effect thereof.

In accordance with various embodiments, at least two channels can differ in their cross section (e.g. width and/or height). What can thus be achieved is that the stability of the support ring is locally different. By way of example, removing the support ring can thus be facilitated (e.g. the support ring may be able to be broken off better).

In accordance with various embodiments, the cross section of the or each channel can be e.g. circular, elliptical, polygonal (e.g. rectangular, e.g. square), e.g. a mixture thereof. Illustratively, the shape of the cross section can be adapted to the conditions.

Figure 2A:
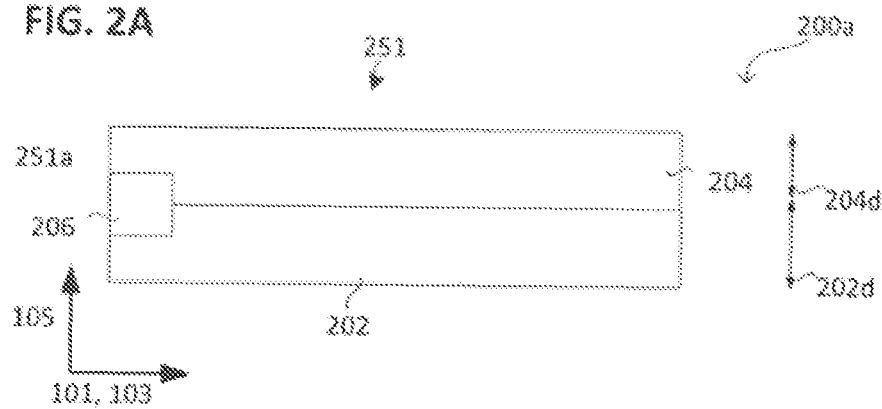
FIGS. 2A to 2C in each case show a method in accordance with various embodiments in a schematic cross-sectional view.
Figure 2B:
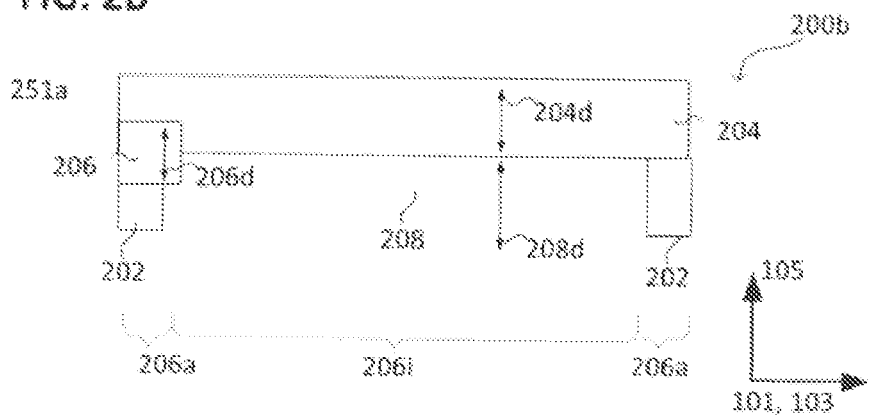
Figure 2C:
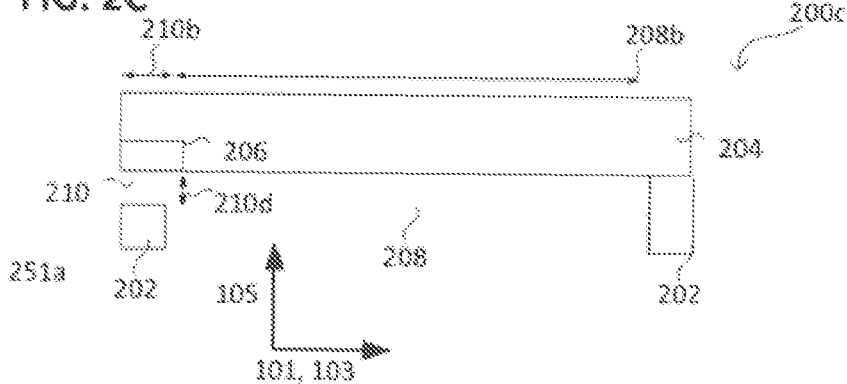

FIG. 2A to FIG. 2C illustrate a method for processing a wafer in accordance with various embodiments in a schematic cross-sectional view. Optionally, a plurality of layer stacks 251 can be processed simultaneously (also referred to as a batch process).

The method may include, in 200a: forming a layer stack 251. The layer stack 251 may include a support layer 202 and a useful layer 204. Furthermore, the layer stack 251 may include a sacrificial region 206 arranged between the support layer 202 and the useful layer 204. The sacrificial region 206 can extend at least partly into the support layer 202 and/or into the useful layer 204. The sacrificial region 206 can adjoin an exterior 251a of the layer stack 251, i.e. include or at least partly expose part of an exposed outer wall of the layer stack 251.

The sacrificial region 206, e.g. its chemical composition and/or physical structure, can be configured in such a way that the sacrificial region 206, vis-à-vis a processing fluid, has a lower mechanical and/or chemical resistance than the support layer 202 and/or than the useful layer 204. The term "resistance" in connection with processing can be understood as endurance vis-à-vis a mechanical and/or chemical alteration which is brought about by the processing, e.g. vis-à-vis a chemical reaction (e.g. oxidation) and/or vis-à-vis a material erosion. A greater resistance results in a slower alteration. By way of example, a structure (e.g. a region or a layer) and/or a material can be altered by the processing to a lesser extent and/or more slowly the greater its resistance. The resistance can be related to a specific processing fluid and/or deviate from one another for different processing fluids.

The resistance of the sacrificial region 206 can be for example less than approximately 75% (e.g. less than approximately 50%, e.g. less than approximately 25%, e.g. less than approximately 5%, e.g. less than approximately 1%, e.g. less than approximately 0.1%, e.g. less than approximately 0.01%, e.g. less than approximately 0.001%, e.g. less than approximately 0.0001%) of the resistance of the useful layer 204 and/or of the support layer 202. By way of example, the selectivity between porous silicon (e.g. in the sacrificial region 206) and monocrystalline silicon (e.g. in the support layer 202 and/or in the useful layer 204) can differ by a factor of $10^{-5}$. A similar difference in selectivity can be achieved between silicon dioxide ($SiO_2$) (e.g. in the sacrificial region 206) and silicon (e.g. in the support layer 202 and/or in the useful layer 204), e.g. with the use of hydrofluoric acid (HF) as processing fluid. The selectivity can represent the speed at which e.g. the etching of a region or material is carried out. To put it more generally, a high selectivity can describe the fact that a specific chemical reaction preferably takes place. The selectivity can be indirectly proportional to the resistance.

A mechanical and/or chemical resistance can be reduced, for example, by an exposed surface area being increased. Thus, for a chemically reactive processing fluid, for example, it is possible to provide a larger surface area that can be attacked by the processing fluid. Alternatively or additionally, a mechanical and/or chemical resistance can be increased by a mechanical hardness being increased and/or a chemical reactivity vis-à-vis the processing fluid being reduced (also referred to as passivation). The chemical reactivity can describe the ability of a material to enter into a chemical reaction, e.g. the speed at which the chemical reaction takes place or the energy threshold necessary to initiate the reaction (also referred to as activation energy).

By way of example, the sacrificial region 206 can have a lower mechanical hardness, greater chemical reactivity and/or greater roughness (e.g. on account of a porous surface) than the support layer 202 and/or than the useful layer 204. At least one of the chemical reactivity, roughness, dopant concentration, defect density, porosity and/or softness (corresponds to the inverse hardness) of the sacrificial region 206 can be less than approximately 75% (e.g. less than approximately 50%, e.g. less than approximately 25%, e.g. less than approximately 5%, e.g. less than approximately 1%, e.g. less than approximately 0.1%, e.g. less than approximately 0.01%, e.g. less than approximately 0.001%, e.g. less than approximately 0.0001%) of the corresponding chemical reactivity, roughness, dopant concentration, defect density, porosity and/or softness of the useful layer 204 and/or of the support layer 202.

The useful layer 204 and/or the support layer 202 can be extended along a lateral plane 101, 103. A (vertical) extent 204d of the useful layer 204 (illustratively a thickness 204d of the useful layer 204) can be less than a (vertical) extent 202d of the support layer 202 (illustratively a thickness 202d of the support layer 202). Alternatively or additionally, a thickness (extent along direction 105) of the layer stack 251 (e.g. including the support layer 202 and the useful layer 204), e.g. the sum of thickness 202d and thickness 204d, can be for example 500 µm or more.

The method may furthermore include, in 200b: forming a depression 208 through the support layer 202 or at least into the latter. The depression 208 can be configured in such a way that the sacrificial region 206 is at least partly exposed by means of the depression 208. The depression 208 can be formed in an inner section 206i of the support layer 202, which is surrounded by an outer section 206a of the support layer 202. Alternatively or additionally, at least part of the sacrificial region 206 can be removed before the depression 208 is formed.

The (vertical) extent 204d of the useful layer 204 can be less than a depth 208d of the depression 208, i.e. a (vertical) extent 208d with which the depression 208 extends into the support layer 202. Optionally, the useful layer 204 can be partly exposed by means of the depression 208. Optionally, the depression 208 can extend at least partly into the useful layer 204.

The remaining section 206a of the support layer 202 (also referred to as outer section 206a of the support layer 202) may include or be formed from a so-called support ring (e.g. a Taiko ring). Illustratively, the depth 208d of the depression 208 can define the thickness 208d of the support ring and thus define the degree of stiffening.

The remaining support layer 202 (illustratively an outer section 206a of the support layer 202) can surround the depression 208 along a lateral direction 101, 103. By way of example, the remaining support layer 202 can extend along a path around the depression 208, e.g. in a ring-shaped fashion, elliptically, polygonally (e.g. in a rectangular fashion, e.g. in a square fashion), etc. The path can run parallel to the lateral plane 101, 103.

Forming the depression 208 (also referred to as thinning the support layer 202) can be carried out mechanically, chemically and/or thermally. In accordance with various embodiments, the depression 208 can be formed by means of a subtractive (separating) process, e.g. by means of chemical erosion (e.g. etching), by means of electrochemical erosion (e.g. eroding), by means of thermal erosion (e.g. plasma etching or laser ablation) and/or by means of mechanical separation (e.g. machining, such as grinding). Material can be removed from the support layer 202 by means of the subtractive process. By way of example, the depression 208 can be formed by means of grinding.

Forming the depression 208 (also referred to as thinning the support layer 202) can be carried out for example by means of mechanical erosion, e.g. by means of a machining fabrication method, such as e.g. grinding (also referred to as back grinding). Optionally, forming the depression 208 can be supported by means of an etching liquid.

A (vertical) extent 206d of the sacrificial region 206 can be less than the (lateral) extent 208d of the depression 208 and/or the (lateral) extent 202d of the support layer 202. The sacrificial region 206 can be at a distance from a surface of the useful layer 204 which is situated opposite the support layer 202. Alternatively or additionally, the sacrificial region 206 can be at a distance from a surface of the support layer 202 which is situated opposite the useful layer 204.

The method can furthermore include, in 200c: forming at least one channel 210 in the exposed sacrificial region 206 by means of the processing fluid (i.e. using the processing fluid). The channel 210 can connect the depression 208 to an exterior 251a of the layer stack 251. In other words, the channel 210 can extend through the sacrificial region 206. The channel 210 can (laterally) adjoin the depression 208.

Forming the channel 210 may include removing at least part of the sacrificial region 206 (e.g. the material thereof, also referred to as sacrificial material). By way of example, the sacrificial region 206 (e.g. the material thereof) can be completely removed. The at least partial removal of the sacrificial region 206 can be carried out by means of the processing fluid. By way of example the removal can be carried out through the depression 208 and/or from the exterior 251a. The at least partial removal of the sacrificial region 206 through the depression 208 can be carried out for example by means of a centrifugal process (also referred to as spin process), i.e. while the layer stack 251 is rotated. The at least partial removal of the sacrificial region 206 from the exterior 251a can be carried out before and/or after the formation of the depression 208. By way of example, the sacrificial region 206 (or the sacrificial material thereof) can be etched from the outside inward and/or from the inside outward (e.g. by means of a wet bench) e.g. before the formation (e.g. by means of grinding) of the depression 208.

In accordance with various embodiments, the sacrificial region 206 can be at least partly (i.e. partly or completely) removed in order to form a or the channel 210. At least partly removing the sacrificial region 206 may include partly or completely removing the sacrificial region 206 (or the sacrificial material thereof). At least partly removing the sacrificial region 206 may include partly or completely removing the sacrificial material from the sacrificial region 206.

In accordance with various embodiments, the layer stack 251 (e.g. the wafer) can be dipped into the processing fluid (e.g. by means of a wet bench) in order to form a or the channel 210.

In accordance with various embodiments, the channel 210 can be understood as an opening which extends through a solid material (e.g. a structure) (i.e. a through opening). Transversely with respect to its extension (i.e. the lateral extent 210b of the channel 210), the opening can be delimited on opposite side walls along a first direction 105 and can be delimited on opposite side walls along a second direction.

The second direction can be transverse (i.e. perpendicular) to the first direction. In other words, a channel can denote a through opening which is completely surrounded by a circumferential wall. Illustratively, the channel 210 may include side walls, a top wall and a bottom wall (i.e. can illustratively be a tunnel).

In a plurality of embodiments, a plurality of channels 210 can be formed in the sacrificial region 206.

The depression 208 can extend along a first direction 105 (also referred to as vertical direction 105, i.e. a direction transversely with respect to the lateral plane 101, 103) through the support layer 202 or at least into the latter. The or each channel 210 can extend along a second direction 101, 103 (also referred to as lateral direction 101, 103, i.e. a direction in or parallel to the lateral plane 101, 103) through the sacrificial region 206 or at least into the latter.

In order to form the or each channel 210, the processing fluid can act on the layer stack 251, e.g. on at least the sacrificial region 206. If the processing fluid acts on the useful layer 204, the processing fluid can remove the useful layer 204 (e.g. the material thereof) more slowly (e.g. not at all, or scarcely) than the sacrificial region 206 (e.g. the material thereof). In other words, the useful layer 204 can have a greater resistance than the sacrificial region 206 vis-à-vis the processing fluid. If the processing fluid acts on the support layer 202, the processing fluid can remove the support layer 202 (e.g. the material thereof) more slowly (e.g. not at all, or scarcely) than the sacrificial region 206 (e.g. the material thereof). In other words, the support layer 202 can have a greater resistance than the sacrificial region 206 vis-à-vis the processing fluid.

In accordance with various embodiments, the processing fluid may include an etching liquid, an etching gas and/or an etching plasma. In other words, forming the at least one channel 210 can be carried out by means of an etching process, e.g. by means of dry etching (e.g. using an etching plasma or etching gas) and/or wet-chemically (by means of an etching liquid). The processing fluid (e.g. the etching plasma) may include or be formed from an ionized gas. The processing fluid (e.g. the etching plasma and/or the etching gas) can be configured to react chemically with the sacrificial region 206, e.g. to form a volatile reaction product. The etching plasma can be formed by means of a plasma source, e.g. using a plasma-forming gas, such as, for example, a gas including a halide or a gas including hydrogen. The etching liquid may include or be formed from, for example, hydrofluoric acid (HF), ammonium fluoride, ammonia water, nitric acid, phosphoric acid, sulfuric acid or hydrogen peroxide. The etching gas may include or be formed from, for example, a gas including fluorine (e.g. a perfluorinated hydrocarbon or an inorganic fluorine compound) or oxygen.

The chemical composition of the processing fluid can be dependent on and be adapted to the chemical composition of the layer stack 251. Some possible combinations are specified below by way of example:

The processing fluid (e.g. an etching liquid) may include or be formed from HF if the sacrificial region 206 (or the sacrificial material thereof) has a smaller substance amount proportion (relative proportion of the substance amount in the total substance amount) of silicon than the useful layer 206 and/or than the support layer 202.

Example 1

The sacrificial region 206 (or the sacrificial material thereof) including or formed from $SiO_2$; and/or the useful layer 206 and/or the support layer 202 including or formed from elemental silicon; the processing fluid can then include or be formed from HF.

Example 2

The sacrificial region 206 (or the sacrificial material thereof) including Si having a greater porosity than the silicon of the useful layer 206 and/or of the support layer 202, the processing fluid can then include HF, e.g. a mixture including or formed from HF and hydrogen peroxide ($H_2O_2$).

Example 3

The sacrificial region 206 (or the sacrificial material thereof) including Si having a greater substance amount proportion of Ge (e.g. 24 at. % Ge or less) than the Si of the useful layer 206 and/or of the support layer 202, the processing fluid can then include HF, e.g. a mixture including or formed from HF, ammonium fluoride ($NH_4F$), $H_2O_2$ and ammonia water ($NH_4OH$) (e.g. in a ratio of 20:12:3:5 to one another). By way of example, the ammonium fluoride can be 40% strength.

The processing fluid (e.g. a plasma or an etching gas) may include or be formed from tetrafluoromethane ($CF_4$) if the sacrificial region 206 (or the sacrificial material thereof) has a greater substance amount proportion of oxygen than the useful layer 206 and/or than the support layer 202. Optionally, the processing fluid may include fluoroform ($CHF_3$) and/or sulfur (e.g. in S8 configuration).

Example 1

The sacrificial region 206 (or the sacrificial material thereof) including or formed from $SiO_2$; and/or the useful layer 206 and/or the support layer 202 including or formed from elemental silicon; the processing fluid can then include or be formed from a CHF3/CF4 mixture and/or a CF4/S8 mixture.

The processing fluid (e.g. a plasma or an etching gas) may include or be formed from a gas including a halide (e.g. fluorine, chlorine and/or bromine) if the sacrificial region 206 (or the sacrificial material thereof) has a smaller substance amount proportion of silicon than the useful layer 206 and/or than the support layer 202.

Example 1

The sacrificial region 206 (or the sacrificial material thereof) including Si having a greater substance amount proportion of Ge (e.g. 24 at. % Ge or more) than the Si of the useful layer 206 and/or of the support layer 202, the processing fluid can then include or be formed from sulfur hexafluoride (SF6).

Example 2

The sacrificial region 206 (or the sacrificial material thereof) including Si having a greater porosity than the silicon of the useful layer 206 and/or of the support layer 202, the processing fluid can then include include or be formed from SF6.

Example 3

The sacrificial region 206 (or the sacrificial material thereof) including Si having a greater porosity than the silicon of the useful layer 206 and/or of the support layer 202, the processing fluid can then include or be formed from nitrogen trifluoride (NF3), elemental chlorine ($Cl_2$) and/or hydrogen bromide (HBr), e.g. a mixture thereof.

Example 4

The sacrificial region 206 (or the sacrificial material thereof) including Si having a greater porosity than the silicon of the useful layer 206 and/or of the support layer 202, the processing fluid can then include tetrafluoromethane and/or elemental oxygen ($O_2$), e.g. a mixture thereof.

An appropriate processing fluid can be chosen depending on the chemical composition of the layer stack. The processing fluid can be configured for chemically reacting with the sacrificial region (or the sacrificial material thereof), for example with (e.g. exclusive) formation of one fluid reaction product or a plurality of fluid reaction products, e.g. to form a reaction product that is gaseous, liquid, soluble in the processing fluid or volatile. The processing fluid can optionally be heated, irradiated and/or caused to have current flow through it.

In accordance with various embodiments, the sacrificial region 206 (or the sacrificial material thereof) can have a greater substance amount proportion of Si than the useful layer 206 and/or than the support layer 202. Alternatively or additionally, the sacrificial region 206 (or the sacrificial material thereof) can have a smaller substance amount proportion of Ge than the useful layer 206 and/or than the support layer 202. By way of example, the sacrificial region 206 can be formed by depositing Si on SiGe.

In various alternative embodiments, the sacrificial region 206 (or the sacrificial material thereof) can have a smaller substance amount proportion of Si than the sacrificial region 206 and/or than the support layer 202. Alternatively or additionally, the sacrificial region 206 (or the sacrificial material thereof) can have a greater substance amount proportion of Ge than the useful layer 206 and/or than the support layer 202. By way of example, the sacrificial region 206 can be formed by depositing SiGe on Si.

Alternatively, the processing fluid may include or be formed from a liquid jet which acts (e.g. at a high pressure) on the sacrificial region 206, e.g. a water jet. Illustratively, it is possible to reduce the resistance of the sacrificial region 206 vis-à-vis the mechanical action of the liquid jet, e.g. by means of the pores.

The processing fluid can enable for example anisotropic etching, e.g. along a lateral direction 101, 103 (i.e. a direction in or parallel to the lateral plane 101, 103) more rapidly than along a vertical direction 105 (i.e. a direction transversely with respect to the lateral plane 101, 103).

A (vertical) extent 210d of the or each channel 210 can be less than a (vertical) extent of the depression 208 and/or of the support layer 202. The or each channel 210 can be at a distance from a surface of the useful layer 204 which is situated opposite the support layer 202. Alternatively or additionally, the or each channel 210 can be at a distance from a surface of the support layer 202 which is situated opposite the useful layer 204.

In accordance with various embodiments, the shape of the or each channel can be adapted to the conditions. By way of example, the or each channel can have a round (e.g. circular or elliptical) or polygonal (e.g. square or rectangular) cross-sectional area (e.g. cut transversely with respect to the lateral plane 101, 103 and/or cut transversely with respect to the extension thereof).

In accordance with various embodiments, a lateral extent 208b of the depression 208 can be greater (e.g. more than approximately 200% greater, e.g. more than approximately 500% greater, e.g. more than approximately 1000% greater) than a lateral extent 210b of at least one of the following: of the outer section 206a of the support layer 202, of the sacrificial region 206, of the at least one channel 210.

Optionally, the method may include: processing the thinned region (i.e. the region exposed by means of the depression 208) by means of a liquid. The processing may include: resist coating by means of the liquid (e.g. including a resist); developing the liquid (e.g. by means of lithography); cleaning by means of the liquid (e.g. including a purge liquid or an etching liquid); etching by means of the liquid (e.g. including an etching liquid); and/or masking by means of the liquid (e.g. using a spin process).

FIG. 3A to FIG. 3C illustrate a method for processing a wafer in accordance with various embodiments in a schematic cross-sectional view.

In 300a to 300c, the layer stack 251 may include at least one electrical circuit element 302 or the latter can be formed in the layer stack 251. The at least one electrical circuit element 302 can be arranged and/or formed in the useful layer 204. The at least one electrical circuit element 302 can be or form for example part of a semiconductor chip (also referred to as chip). By way of example, a semiconductor chip can be formed in a plurality of process steps, of which at least one process step is carried out before forming the depression 208 and/or of which at least one or the process step is carried out after forming the depression 208.

The layer stack 251 may include more than one electrical circuit element 302 and/or more than one chip, e.g. two, three, four, five, six, seven, eight, nine, ten, or more than ten, e.g. twenty, fifty, one hundred, or more than one hundred, e.g. two hundred, five hundred, one thousand or more than one thousand, electrical circuit elements 302 and/or chips.

In other words, at least part of the chip can be produced before the depression 208, e.g. a pn junction of the chip. Alternatively or additionally, at least part of the chip can be produced after forming the depression 208, e.g. a contact terminal of the chip (also referred to as contact pad).

The method may include may include, in 000a forming or processing at least one electrical circuit element 302 or at least part thereof before forming the depression 208, e.g. after forming the sacrificial region 206.

The method can alternatively or additionally include, in 000c, exposing the at least one electrical circuit element 302 (i.e. the rear side thereof) or at least part thereof by means of the depression 208.

A (vertical) extent 302d of the or each circuit element 302 (illustratively a thickness 302d of the or each circuit element 302) can be less than the (vertical) extent of the support layer 202 and/or of the depression 208.

The method can alternatively or additionally include, in 000c, forming or processing at least one electrical circuit element 302 or at least part thereof after forming the depression 208, e.g. before forming the channel 210. By way of example, a section of the useful layer 204 can be doped through the depression 208, e.g. for forming a pn junction. Optionally, the doping can furthermore be activated, e.g. by means of a thermal method (e.g. implantation activation). Activating may include incorporating the dopant into the crystal lattice of the useful layer 204. In this case, the electrical properties of the useful layer 204 can change (permanently); by way of example, an electrical conductivity of the doped section can be altered (e.g. reduced or increased) by means of the activating. If, for example, a p-type dopant is activated in an undoped or already p-doped substrate (e.g. boron in a p-doped substrate), the electrical conductivity can increase. If, for example, an n-type dopant is activated in an already p-doped substrate (e.g. arsenic in a p-doped substrate), the electrical conductivity can decrease.

The method can alternatively or additionally include, in 000c, forming or processing at least one electrical circuit element 302 or at least part thereof after forming the channel 210. By way of example, in order to form the at least one electrical circuit element 302, an etching liquid can be introduced into the depression 208, which etching liquid can escape from the depression 208 e.g. partly through the or each channel 210. Optionally, a plurality of layer stacks 251 can be processed simultaneously (batch process).

A (vertical) extent 210d of the or each channel 210 can be less than a (vertical) extent of the depression 208 and/or of the support layer 202.

In accordance with various embodiments, the at least one electrical circuit element 302 can be formed, e.g. partly or completely, before forming the depression 208. This can facilitate the formation of the at least one electrical circuit element 302 (e.g. on or from the front side of the layer stack 251). Alternatively or additionally, the at least one electrical circuit element 302 can be formed, e.g. partly or completely, after forming the depression 208. This can facilitate the formation of the at least one electrical circuit element 302 (e.g. on or from the front side of the layer stack 251). By way of example, before the at least one electrical circuit element 302 (e.g. including or formed from one or a plurality of circuits) is formed (i.e. after the deposition of the useful layer, e.g. after the epitaxial deposition), a rear-side support ring 206a can be formed.

Figure 1B:
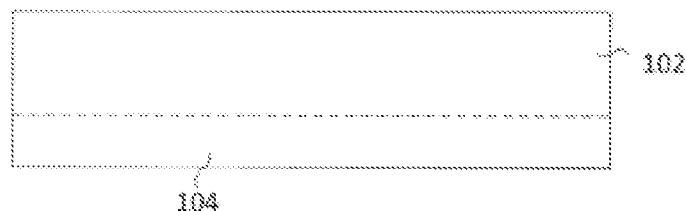
Figure 1C:
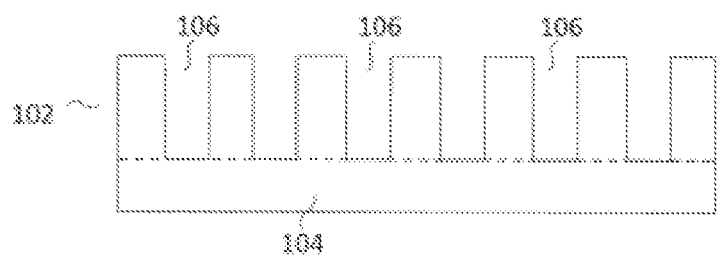

FIG. 1A to FIG. 1C illustrate a method for processing a wafer in accordance with various embodiments in a schematic side view or cross-sectional view.

The method may include, in 100a: providing the support layer 202. The support layer 202 may include or be formed from a semiconductor region. The semiconductor region may include or be formed from a first semiconductor material, e.g. a monocrystalline semiconductor material, such as e.g. silicon (Si) or silicon carbide (SiC), gallium nitride (GaN). The support layer 202 may include or be formed from a wafer, for example.

The support layer 202 can have a round (e.g. circular or elliptical) or polygonal (e.g. square or rectangular) cross-sectional area (cut along the lateral plane 101, 103) or a mixture thereof. The method provided can be employed independently of the used lateral extent of the support layer 202. By way of example, the support layer 202 can have a lateral extent of more than approximately 25 mm (millimeters), e.g. more than approximately 50 mm, e.g. more than approximately 100 mm, e.g. more than approximately 150 mm, e.g. more than approximately 200 mm, e.g. more than approximately 250 mm, e.g. more than approximately 350 mm, e.g. more than approximately 400 mm) e.g. more than approximately 450 mm, e.g. more than approximately 500 mm, e.g. more than approximately 600 mm.

The method can optionally include, in 100b: forming the sacrificial region 206 above and/or in the support layer 202.

Forming the sacrificial region 206 in the support layer 202 can be carried out, for example, by a section 206a (e.g. an outer section 206a) of the support layer 202 (e.g. the material thereof, also referred to as base material) in which the sacrificial region 206 is intended to be formed being chemically and/or structurally altered, e.g. irradiated by means of particles, etched, doped, oxidized (e.g. local oxidation) etc.

By way of example, an impurity (e.g. a dopant or contaminants) can be introduced into the section 206a of the support layer 202 (e.g. if the support layer 202 includes or is formed from SiC), for example by means of diffusion and/or implantation. The sacrificial region 206 can then have a greater impurity concentration than the support layer 202. Alternatively or additionally, the sacrificial region 206 can differ from the support layer 202 in terms of its chemical composition.

In accordance with various embodiments, in order to form the sacrificial region (or the sacrificial material thereof) a compound semiconductor can be formed in a or the section 206a of the support layer 202. By way of example, the section 206a may include a semiconducting base material (e.g. silicon), into which a semiconducting impurity (e.g. germanium) is introduced. By way of example, it is possible to form an impurity concentration (i.e. a number of atoms of the impurity) in the outer section 206a of the support layer 202 of more than in the inner section 206i of the support layer 202, e.g. of more than approximately $10^{15}$ atoms per cubic centimeter (atoms/cm$^3$), e.g. of more than approximately $10^{16}$ atoms/cm$^3$, e.g. of more than approximately $10^{17}$ atoms/cm$^3$, e.g. of more than approximately $10^{18}$ atoms/cm$^3$, e.g. of more than approximately $10^{19}$ atoms/cm$^3$, e.g. of more than approximately $10^{20}$ atoms/cm$^3$, e.g. of more than approximately $10^{21}$ atoms/cm$^3$, e.g. of more than approximately $10^{22}$ atoms/cm$^3$, e.g. of more than approximately $10^{23}$ atoms/cm$^3$ or even more. By way of example, it is possible to form in the section 206a of the support layer 202 a silicon-germanium (SiGe) compound semiconductor (e.g. by introducing germanium), e.g. including approximately 0.001 at. % (atom percent) to 10 at. % germanium, e.g. including approximately 0.001 at. % to 5 at. % germanium. If more impurity (e.g. germanium) is intended to be introduced into the section 206a of the support layer 202, it may be simpler to deposit the sacrificial material having the corresponding chemical composition on the section 206a of the support layer 202, at is described in greater detail below.

Alternatively or additionally, defects (e.g. lattice defects, pores or capillaries) can be formed in the outer section 206a of the support layer 202, e.g. by means of a structural alteration of the outer section 206a of the support layer 202, for example by means of etching (e.g. selective etching) and/or by means of ion irradiation. After processing, the layer stack 151 can have a greater defect density in the sacrificial region 206 than the support layer 202. By way of example, the sacrificial region 206 can have a greater porosity than the support layer 202. The defect density can denote the number of defects (e.g. pores_per volume, i.e. a spatial density. The defects can be produced artificially in order to set the resistance. The defects can reduce the chemical resistance vis-à-vis the processing fluid.

Forming the sacrificial region 206 above (e.g. on) the support layer 202 can be carried out for example by depositing a material (also referred to as sacrificial material, e.g. an oxide or SiGe) above a or the section 206a (e.g. an outer section 206a) of the support layer 202, e.g. by means of a vapor deposition, e.g. a physical vapor deposition (PVD) and/or a chemical vapor deposition (CVD), and optionally by means of etching and/or by means of oxidation. In other words, the deposited material can optionally be etched and/or oxidized.

In accordance with various embodiments order to form the sacrificial region, a compound semiconductor can be deposited above a or the section 206a of the support layer 202. The compound semiconductor may include or be formed from, for example, silicon-germanium (SiGe), e.g. including approximately 5 at. % to 95 at. % of germanium, e.g. including approximately 10 at. % to 95 at. % of germanium, e.g. including approximately 20 at. % to 80 at. % of germanium, e.g. including approximately 30 at. % to 70 at. % of germanium, e.g. including approximately 40 at. % to 60 at. % of germanium.

By way of example, the sacrificial material may include an impurity (e.g. a dopant or contaminants). The sacrificial region 206 can then have a greater impurity concentration than the support layer 202. Alternatively or additionally, the sacrificial region 206 can differ from the support layer 202 in terms of its chemical composition.

Alternatively or additionally, the sacrificial material can have a plurality of defects (e.g. lattice defects, pores or capillaries). The sacrificial region 206 can then have a greater defect density than the support layer 202. By way of example, the sacrificial region 206 can have a greater porosity than the support layer 202.

Forming the sacrificial region 206 can be carried out for example by means of an etching liquid (e.g. for forming pores) which acts on the support layer 202 and/or on the sacrificial material. By way of example, forming the sacrificial region 206 can be carried out electrochemically (supported by means of electric current) and/or photoelectrochemically (supported by means of electric current and light). By way of example, the etching liquid may include or be formed from a mixture of hydrofluoric acid and hydrogen peroxide. Particularly deep pores can thus be achieved. Alternatively, the etching liquid may include or be formed from a mixture of acetic acid, nitric acid and hydrofluoric acid. The depth of the pores can thus be reduced. Illustratively, the porosity can be set depending on the chemical composition of the etching liquid.

In order to form the sacrificial region 206, it is possible optionally to use a mask which leaves free that section 206a of the support layer 202 in which the sacrificial region 206 is intended to be formed.

The method may include, in 100c: forming the useful layer 204 above the support layer 202. The useful layer 204 may include or be formed from a semiconductor region. The semiconductor region, may include or be formed from a second semiconductor material, e.g. a monocrystalline semiconductor material, e.g. identical to the first semiconductor material. Alternatively, the first semiconductor material and the second semiconductor material can be different from one another, e.g. in the case of SiC above porous Si. In general, in accordance with various embodiments, on a porous semiconductor material (e.g. porous silicon) it is possible to grow a semiconductor material different therefrom.

The useful layer 204 and the support layer 202 (i.e. their materials) can have an epitaxial relation to one another. In other words, the crystal structures of the useful layer 204 and of the support layer 202 can have a defined orientation with respect to one another, e.g. the same orientation. The useful layer 204 can for example be grown epitaxially on the support layer 202, e.g. homoepitaxially or heteroepitaxially. In other words, the useful layer 204 may include or be formed from an epitaxial layer (EPI layer).

By way of example, the useful layer 204 and the support layer 202 (in the case of homoepitaxy) can correspond in terms of their crystal structure and/or in terms of their chemical composition. By way of example, EPI gallium nitride 204 can be formed above a gallium nitride wafer 202. Alternatively, EPI silicon carbide 204 can be formed above a silicon carbide wafer 202.

Alternatively, the useful layer 204 and the support layer 202 (in the case of heteroepitaxy) can differ in terms of their crystal structure and/or chemical composition. By way of example, EPI gallium nitride can be formed above a silicon wafer 202.

In accordance with various embodiments, porous silicon (e.g. as sacrificial material) can be formed above a silicon wafer 202. Alternatively or additionally, silicon (e.g. as useful layer, e.g. EPI silicon) can be formed above porous silicon (e.g. the sacrificial material). In general, in accordance with various embodiments, an identical semiconductor material can be grown on a porous semiconductor material (e.g. porous silicon).

In general, the term "porous" with regard to a material, a region or a layer can be understood to mean that it has a greater porosity than the useful layer 204 and/or than the support layer 202.

As an alternative or in addition to 100b, in 100c forming the sacrificial region 206 in the useful layer 204 can be carried out, e.g. simultaneously with or after the formation of the useful layer 204. Forming the sacrificial region 206 in the useful layer 204 can be configured similarly to forming the sacrificial region 206 in the support layer 202. By way of example, the useful layer 204 can be locally chemically and/or structurally altered, e.g. irradiated by means of particles, etched, doped, etc.

The method can furthermore include, in 100c: forming at least one circuit element 302 in the useful layer 204. Forming the circuit element 302 may include forming at least one pn junction in the useful layer 204, e.g. at least one unipolar junction and/or at least one bipolar junction. Optionally, forming a circuit element 302 may include forming, e.g. applying and/or chemically reacting, at least one layer, e.g. an electrically insulating layer, and/or forming, e.g. applying, at least one electrically conductive layer (e.g. a metallization). Optionally, forming the circuit element 302 may include structuring the at least one layer.

The useful layer 204 (e.g. a or each circuit element 302 arranged therein) can be electrically contacted by means of an electrically conductive layer (e.g. a metallization). By way of example, a first electrically conductive layer can be formed on the opposite side of the useful layer 204 relative to the depression 208. Alternatively or additionally, a second electrically conductive layer can be formed in the depression 208. The metallization can have a greater electrical conductivity than the useful layer 204 and/or than the support layer 202. The metallization may include or be formed from a metal.

FIG. 2A to FIG. 2C illustrate a method for processing a wafer in accordance with various embodiments in a schematic cross-sectional view.

The method may include, in 200a: forming the sacrificial region 206. Forming the sacrificial region 206 may include forming a plurality of segments 206s of the sacrificial region 206 which are at a distance from one another. In other words, the sacrificial region 206 may include or be formed from a plurality of segments 206s. The segments 206s can be separated from one another by means of a region (also referred to as support region 202s) of the outer section 206a of the support layer which has a greater resistance vis-à-vis the processing fluid than the sacrificial region 206.

The sacrificial region 206 (e.g. the plurality of segments 206s thereof) can have vis-à-vis the processing fluid a lower resistance than the support region 202s and/or than the useful layer 204. By way of example, the sacrificial region 206 (e.g. the plurality of segments 206s thereof) can have a lower mechanical hardness, greater chemical reactivity and/or greater roughness than the support region 202s.

The method may include, in 200b: forming a channel 210 in each segment 206s of the plurality of segments 206s, for example in each segment 206s of the sacrificial region 206.

The method may include, in 200c: forming the depression 208. The depression 208 can be formed before or after the or each channel 210. A cross section 111 through the inner section 206i of the support layer is illustrated in 200c (cf. FIG. 6B).

FIG. 3A and FIG. 3B illustrate a method for processing a wafer in accordance with various embodiments in a schematic cross-sectional view.

The method may include, in 300a: securing the layer stack 251 on a carrier 602, e.g. before the depression 208 is formed. The (e.g. temporary or permanent) carrier 602 can be secured on a side of the useful layer 204 facing away from the support layer 202.

The carrier 602 may include or be formed from an inorganic material (e.g. a ceramic or metal) and/or may include or be formed from an organic material (e.g. a polymer). By way of example, the carrier 602 may include or be formed from a plate or a film.

In 300b, the layer stack 251 is illustrated in a cross section along the lateral plane 101, 103, e.g. cut through the sacrificial region 206 and/or along an interface between the support layer 202 and the useful layer 204. The layer stack 251 may include a support layer 202 (e.g. including or formed from a wafer) and a useful layer 204 (e.g. including or formed from an epitaxial layer).

Forming the useful layer 204 can be carried out by means of an ELO process ("Epitaxial Lateral Overgrowth"). By way of example, in the sacrificial region 206 it is possible to form a local oxide (e.g. by means of a LOCOS process) which is locally overgrown. LOCOS can also be referred to as "local oxidation of silicon".

Forming the useful layer 204 can be carried out by means of structuring. By way of example, an oxide can be locally structured.

Furthermore, the layer stack 251 can have a depression 208, which extends through the support layer 202 or at least into the latter.

Furthermore, the layer stack 251 may include at least one channel 210, which extends through between the support layer 202 and the useful layer 204 from the depression 208 to an exterior 251a of the layer stack 251.

The layer stack 251 may include e.g. more than one channel 210, e.g. two, three, four, five, six, seven, eight, nine, ten, or more than ten, e.g. twenty, fifty, one hundred, or more than one hundred, e.g. two hundred, five hundred, one thousand or more than one thousand, channels 210.

In accordance with various embodiments, a lateral extent 210b of the or each channel 210 and/or a vertical extent 210d of the or each channel 210 can be in a range of approximately 5 μm (micrometers) to approximately 20 mm (millimeters), e.g. in a range of approximately 50 μm to approximately 1 mm, e.g. in a range of approximately 50 μm to approximately 500 μm. By way of example, the lateral extent 210b of the or each channel 210 can be in a range of approximately 1% to approximately 80% of the circumference of the layer stack 251 (in the lateral plane 101, 103), e.g. in a range of approximately 5% to approximately 90% of the circumference of the layer stack 251, e.g. in a range of approximately 5% to approximately 50% of the circumference of the layer stack 251, e.g. in a range of approximately 5% to approximately 30% of the circumference of the layer stack 251.

FIG. 4A to FIG. 4C illustrate a method for processing a wafer in accordance with various embodiments in a schematic cross-sectional view.

The method may include, in 400a: providing a wafer 702 (or more generally a support layer 202). The wafer 702 may include an inner section 206i and an outer section 206a. The outer section 206a can surround the inner section 206i (illustratively e.g. a disk). The outer section 206a (e.g. a ring) can adjoin an exterior 251a of the wafer 702.

The method can furthermore include, in 400b: forming pores in the outer section 206a, e.g. in a region 206 (also referred to as sacrificial region 206) of the outer section 206a and/or in a plurality of segments 206s of the region 206. Illustratively, at least one porous sacrificial region 206 can thus be formed. Forming pores can be carried out by means of an electrochemical process. By way of example, porous silicon can be formed in the sacrificial region 206.

The method can alternatively or additionally include, in 400b: depositing a sacrificial material, e.g. above the outer section 206a. Depositing can be carried out for example using PVD and/or CVD. By way of example, the sacrificial material may include germanium and/or silicon, e.g. a compound semiconductor such as GeSi. The sacrificial material can be configured in such a way that it can be etched more rapidly than the underlying region 202s of the outer section 206a.

The method can alternatively or additionally include, in 400b: doping the outer section 206a (e.g. if the latter includes or is formed from SiC), e.g. in the region 206 and/or in the segments 206s of the region 206. Doping can be carried out for example using boron as dopant. Illustratively, the doping (e.g. with boron, aluminum, phosphorus, argon, nitrogen) can reduce the chemical resistance of the sacrificial region 206. In other words, the sacrificial region 206 can be etched more rapidly, the more highly it is doped, e.g. more rapidly than the non-doped or less doped region 202s of the outer section 206a.

The method can furthermore include, in 400c: epitaxially forming a useful layer 204 above the water 202 and above the sacrificial region 206. The porosity of the sacrificial region 206 (e.g. the segments 206s thereof) can be configured in such a way that the material of the useful layer 204 maintains an epitaxial relation to the sacrificial region 206 (e.g. to the segments 206s thereof). In other words, the pores of the sacrificial region 206 can be formed in such a way that the material of the sacrificial region 206 maintains its epitaxial relation. By way of example, the epitaxial relation can be formed by means of heteroepitaxy (e.g. SiC on porous Si) or homoepitaxy (e.g. SiC on SiC).

In accordance with various embodiments, porosity can be understood to be a dimensionless measurement variable which denotes the ratio of void volume to total volume of a material, region or section.

In accordance with various embodiments, a porosity of the sacrificial region 206 (i.e. the volume of voids in the sacrificial region 206 to the volume of the sacrificial region 206) can be less than approximately 50% (e.g. less than approximately 25%, e.g. less than approximately 10%, e.g. less than approximately 5%, e.g. less than approximately 1%) and/or greater than approximately 10%, e.g. greater than approximately 25%, e.g. greater than approximately 50%.

The method can optionally include, in 400c: forming at least one circuit element 302 (e.g. a semiconductor circuit element 302) in the useful layer 204.

FIG. 5A to FIG. 5C illustrate a method for processing a wafer in accordance with various embodiments in a schematic cross-sectional view.

The method may include, in 500a: securing the layer stack 251 on a carrier 602.

The method may include, in 500b: forming the depression 208 in the layer stack 251, e.g. in the inner section 206i of the support layer 202 and/or through said section. By way of example, the inner section 206i of the support layer 202 can be removed.

The sacrificial region 206 (e.g. each of its segments 206s) can extend (along a lateral direction 101, 103) through the outer section 206a.

The method may include, in 500c: forming at least one channel 210 in the sacrificial region 206, e.g. forming a channel 210 in each segment 206s of the sacrificial region 206.

By means of the free-standing outer section 206a of the layer stack 251, it is possible to provide a mechanical stiffening 206a (a stiffening ring 206a) which counteracts damage to the wafer as a result of deformation. Illustratively, during the thinning of the wafer (to the desired thickness) the edge 206a of the wafer is left (also referred to as support ring or rear-side support ring) is left intact, which surrounds the thinned region 208. The mechanical stiffening 206a may include or be formed from at least one wall element which extends (in a vertical direction 105) away from the useful layer 204 and surrounds a cavity 208 (e.g. adjoining the useful layer 204). The wall element 206a can delimit the depression in a lateral direction.

To put it more generally, the outer section 206a (e.g. the stiffening ring 206a) may include a first ply 802, in which the outer section 206a is not interrupted. Between the useful layer 204 and the first ply 802, the outer section 206a may include a second ply 804, which is interrupted by the at least one channel 210. In other words, the second ply 802 of the support layer 202 can delimit the at least one channel 210 on an opposite side relative to the useful layer 204.

By way of example, an epitaxial layer 204 (also referred to as EPI or EPI layer) can be applied to a wafer 202. Afterwards, the wafer 202 can be thinned as far as the epitaxial layer 204 (cf. FIG. 2B, for example). At least one IGBT 302 and/or at least one Emcon diode 302 can be formed in the epitaxial layer 204. To put it more generally, at least one EPI-based semiconductor component can be formed. Thinning the wafer 202 can be configured in such a way that a support ring 206a (e.g. on the rear side of the EPI layer 204) is formed (that is to say that said support ring remains).

Figure 6A:
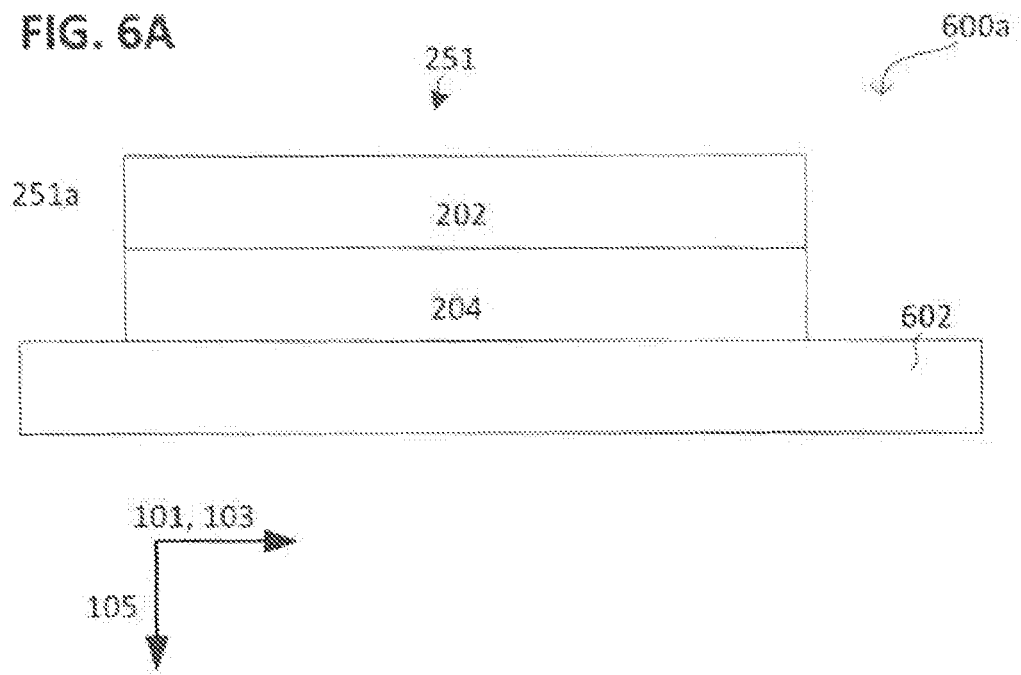
FIGS. 6A and 6B in each case show a method in accordance with various embodiments in a schematic cross-sectional view.
Figure 6B:
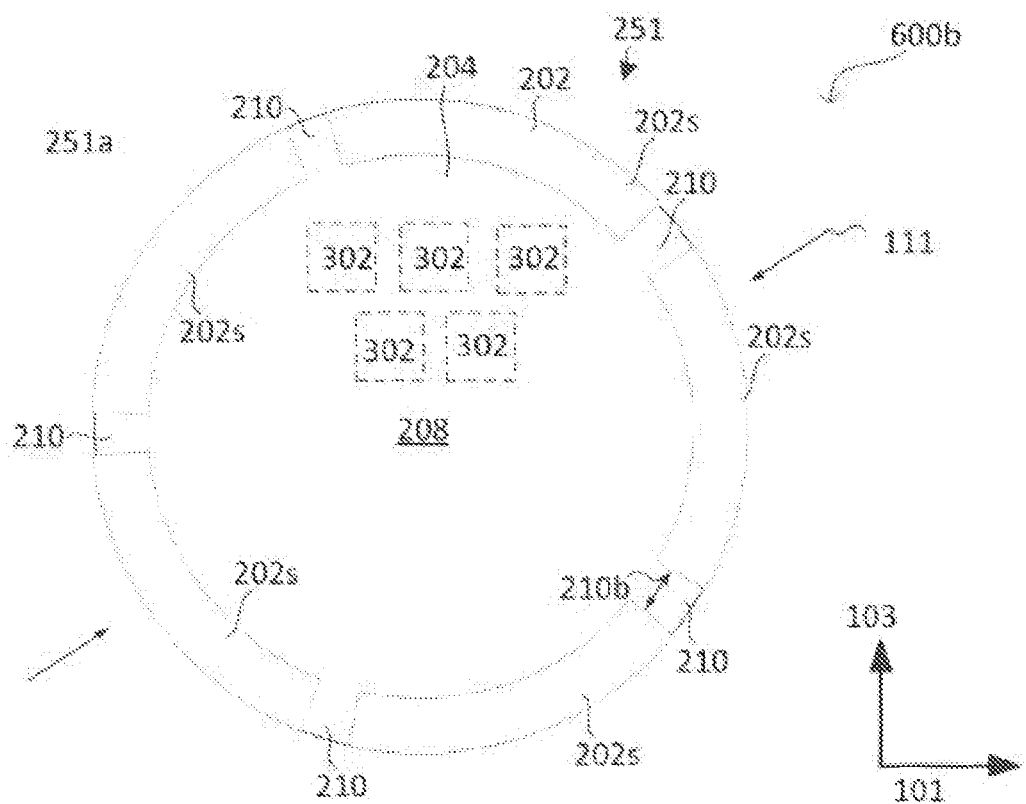
Figure 10:
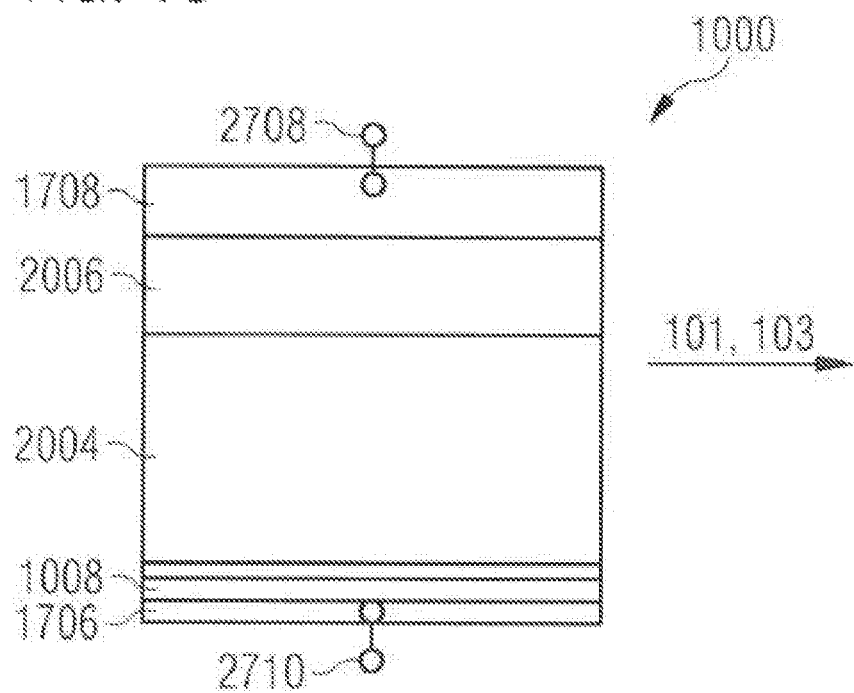
Figure 11A:
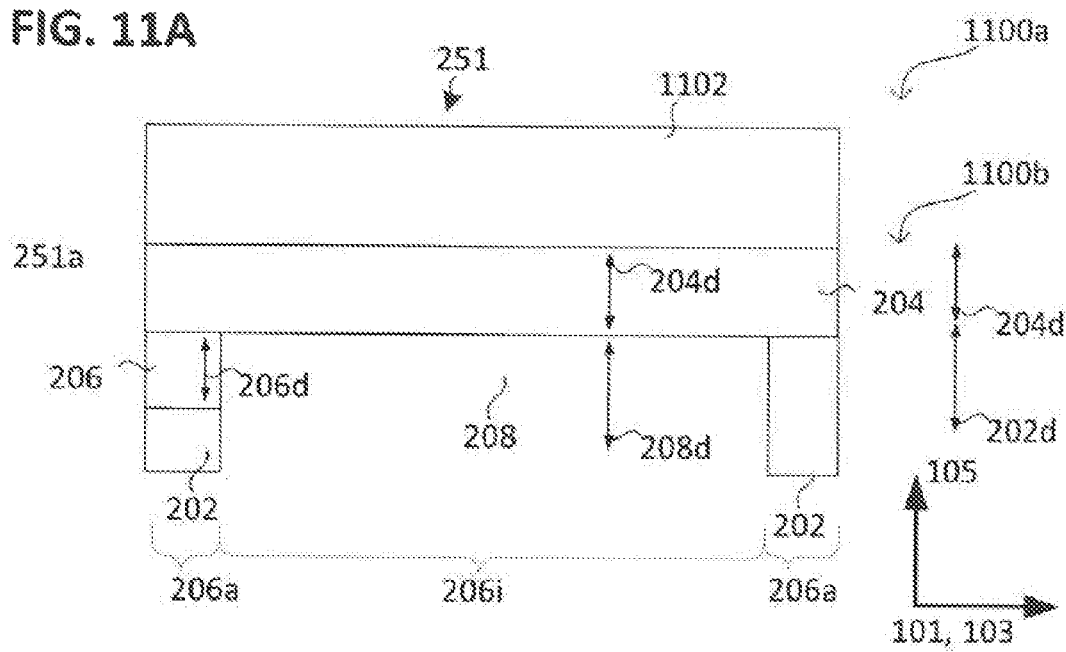
FIGS. 11A and 11B in each case show a method in accordance with various embodiments in a schematic cross-sectional view.
Figure 11B:
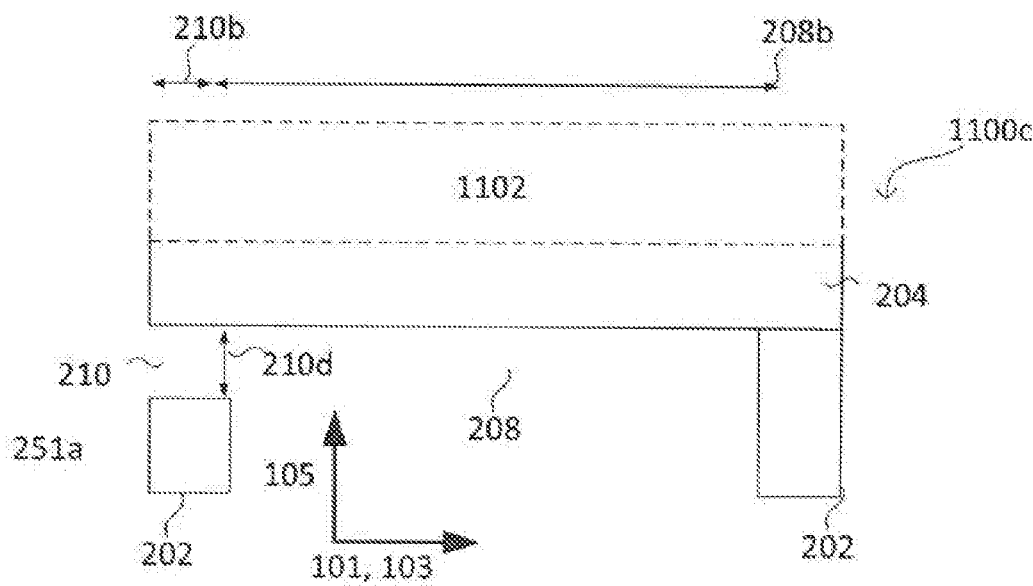

FIG. 6A and FIG. 6B in each case illustrate a circuit element (e.g. providing a vertical current flow) in accordance with various embodiments in a schematic cross-sectional view, e.g. each in a transistor geometry.

The circuit element 600a may include a plurality of contact pads, of which a first contact pad 2708a and a second contact pad 2710 are situated opposite one another. The first contact pad 2708a and the second contact pad 2710 can electrically contact an active region of the circuit element 900a, in which the circuit element 900a includes a multiplicity of semiconductor regions, of which a first semiconductor region 2006 and a second semiconductor region 1008 can be doped with a first dopant of a first type and a third semiconductor region 2008 and a fourth semiconductor region 2004 can be doped with a second dopant of a second type (different than the first type). The first dopant can be a p-type and the second dopant can be an n-type, or vice versa, such that a bipolar junction (a pnp junction or an npn junction) is formed.

The first contact pad 2708a can electrically contact a first electrode 1708a of the circuit element 600a, e.g. a source electrode. The second contact pad 2710 can electrically contact a second electrode 1708b of the circuit element 600a, e.g. a drain electrode. A third contact pad 2708b can electrically contact a third electrode 1708b, e.g. a gate electrode.

The third electrode 1708b can be electrically insulated from the first electrode 1708a and/or from the fourth semiconductor region 2004 by means of an electrical barrier 2208. The plurality of electrodes 1708a, 1708b, 1706 can each be provided by means of a metallization.

The circuit element 600b can be configured similarly thereto, except that the second electrode includes a vertically extended section 2308, which extends into the fourth semiconductor region 2004. The fourth semiconductor region 2004 can optionally have a gradient 2002 in the dopant concentration.

One or a plurality of doped semiconductor regions can be formed by means of doping through the depression 208.

In one or more embodiments, it is also possible to use other circuit elements, e.g. circuit elements providing a lateral current flow.

FIG. 7 illustrates a circuit element 700a in accordance with various embodiments in a schematic cross-sectional view, e.g. in a diode geometry.

A first semiconductor region 2006 can be doped with the first dopant of the first type. A second semiconductor region 1008 and fourth semiconductor region 2004 can be doped with the second dopant of the second type (different than the first type). The first dopant can be a p-type and the second dopant can be an n-type, or vice versa, such that a unipolar junction (pn junction or np junction) is formed.

FIG. 8A to FIG. 8C illustrate a method for processing a wafer in accordance with various embodiments in a schematic cross-sectional view. Optionally, a plurality of layer stacks 251 can be processed simultaneously (also referred to as a batch process).

The method may include, in 800a: forming a layer stack 251. The layer stack 251 may include a wafer 1102, a support layer 202 and a useful layer 204. The support layer 202 and the useful layer 204 can be grown for example onto the wafer 1102, e.g. epitaxially onto the wafer and/or epitaxially onto one another, e.g. homoepitaxially and/or heteroepitaxially.

In accordance with various embodiments, the support layer 202 and the useful layer 204 may include or be formed from the same epitaxial material. Alternatively or additionally, the support layer 202 and the useful layer 204 can be monolithically (integrally) connected to one another.

Alternatively, the support layer 202 and the useful layer 204 can differ in terms of their material and/or their chemical composition.

In accordance with various embodiments, the support layer 202 may include or be formed from a front-side support ring (i.e. can be formed above the front side of the wafer 1102). By way of example, the support layer 202 can be formed before the at least one electrical circuit element 302 is formed (cf. FIG. 3B).

Furthermore, the layer stack 251 may include a sacrificial region 206, which is arranged, e.g. grown, between the support layer 202 and the useful layer 204. The sacrificial region 206 can adjoin an exterior 251a of the layer stack 251, i.e. include or at least partly expose part of an exposed outer wall of the layer stack 251, e.g. on opposite sides in a lateral direction 101, 103.

The sacrificial region 206 can be configured as described above. The sacrificial region 206, e.g. its chemical composition and/or physical structure, can be configured in such a way that the sacrificial region 206 has vis-à-vis a processing fluid a lower mechanical and/or chemical resistance than the support layer 202 and/or than the useful layer 204. The resistance of the sacrificial region 206 can be for example less than approximately 75% (e.g. less than approximately 50%, e.g. less than approximately 25%, e.g. less than approximately 5%, e.g. less than approximately 1%, e.g. less than approximately 0.1%, e.g. less than approximately 0.01%, e.g. less than approximately 0.001%, e.g. less than approximately 0.0001%) of the resistance of the useful layer 204 and/or of the support layer 202.

By way of example, the sacrificial region 206 can have a lower mechanical hardness, greater chemical reactivity and/or greater roughness (e.g. on account of a porous surface) than the support layer 202 and/or than the useful layer 204. At least one of the chemical reactivity, roughness, dopant concentration, defect density, porosity and/or softness (corresponds to the inverse hardness) of the sacrificial region 206 can be less than approximately 75% (e.g. less than approximately 50%, e.g. less than approximately 25%, e.g. less than approximately 5%, e.g. less than approximately 1%, e.g. less than approximately 0.1%, e.g. less than approximately 0.01%, e.g. less than approximately 0.001%, e.g. less than approximately 0.0001%) of the corresponding chemical reactivity, roughness, dopant concentration, defect density, porosity and/or softness of the useful layer 204 and/or of the support layer 202.

The useful layer 204 and/or the support layer 202 can be extended along the lateral plane 101, 103. A (vertical) extent 204d of the useful layer 204 (illustratively a thickness 204d of the useful layer 204) can be less than a (vertical) extent 202d of the support layer 202 (illustratively a thickness 202d of the support layer 202).

The method can furthermore include in 800a: forming the support layer 202 in such a way that the latter has a depression 208, e.g. extended through the support layer 202 or at least into the latter. The depression 208 can be configured in such a way that the sacrificial region 206 is at least partly exposed by means of the depression 208. The depression 208 can be surrounded by an outer section 206a (e.g. ring-shaped section 206a) of the support layer 202. The depression can be formed for example by growing in the inner region 206i no material or less material than in the outer section 206a. By way of example, the support layer 202 can be formed by means of a mask (which shades e.g. the inner section 206i). The depression 208 can extend for example in a vertical direction 105 through the support layer.

The grown section 206a of the support layer 202 (also referred to as outer section 206a of the support layer 202) may include or be formed from a support ring. Illustratively, the depth 208d of the depression 208 can define the thickness 208d of the support ring and thus define the degree of stiffening. A thickness of the layer stack 251 (e.g. including the wafer, the support layer 202 and the useful layer 204) can be for example 500 µm or more.

The grown section 206a can surround the depression 208 along a lateral direction 101, 103. By way of example, the grown section 206a can extend along a path around the depression 208, e.g. in a ring-shaped fashion, elliptically, polygonally (e.g. in a rectangular fashion, e.g. in a square fashion), etc. The path can run parallel to the lateral plane 101, 103. The sacrificial region 206 can be exposed by means of the depression 208 on the opposite side (inner side) relative to the exterior 251a.

The method can optionally furthermore include: thinning the layer stack 251 by removing at least part of the wafer 1102. In other words, the wafer can be partly or completely removed. Thinning the layer stack 251 can be carried out mechanically, chemically and/or thermally. In general, thinning the layer stack 251 can be carried out by means of a subtractive (separating) process, e.g. by means of chemical erosion (e.g. etching), by means of electrochemical erosion (e.g. eroding), by means of thermal erosion (e.g. plasma etching or laser ablation) and/or by means of mechanical separation (e.g. machining, such as grinding). By way of example, thinning the layer stack 251 can be carried out by means of grinding. The resulting configuration of the layer stack 251 after the thinning of the layer stack 251 can be similar to the layer stack 251 shown in FIG. 2B.

Thinning the layer stack 251 can be carried out for example by means of mechanical erosion, e.g. by means of a machining fabrication method, such as e.g. grinding (also referred to as back grinding). Optionally, the thinning of the layer stack 251 can be supported by means of an etching liquid.

A (vertical) extent 206d of the sacrificial region 206 can be less than the (lateral) extent 208d of the depression 208 and/or the (lateral) extent 202d of the support layer 202. The sacrificial region 206 can be at a distance from a surface of the useful layer 204 which is situated opposite the support layer 202, and/or from the wafer 1102. Alternatively or additionally, the sacrificial region 206 can be at a distance from a surface of the support layer 202 which is situated opposite the useful layer 204.

The method can furthermore include, in 1100b: forming at least one channel 210 in the exposed sacrificial region 206 by means of the processing fluid (i.e. using the processing fluid). The channel 210 can connect the depression 208 to an exterior 251a of the layer stack 251. In other words, the channel 210 can extend through the sacrificial region 206. The channel 210 can (laterally) adjoin the depression 208.

Forming the at least one channel 210 can optionally be carried out before or after thinning the layer stack 251.

In accordance with various embodiments, thinning the layer stack 251 can be carried out after the formation of the at least one electrical circuit element 302 (e.g. on or from the front side of the layer stack 251) (cf. FIG. 3B and FIG. 3C). In that case, optionally, thinning the layer stack 251 can be carried out after forming the at least one channel 210. Alternatively or additionally, thinning the layer stack 251 can be carried out before the formation of the at least one electrical circuit element 302 (e.g. on or from the front side of the layer stack 251) (cf. FIG. 3B and FIG. 3C). In that case, optionally, thinning the layer stack 251 can be carried out before forming the at least one channel 210.

Forming the channel 210 may include removing at least part of the sacrificial region 206 (e.g. the material thereof, also referred to as sacrificial material). By way of example, the sacrificial region 206 (e.g. the material thereof) can be completely removed. The at least partial removal of the sacrificial region 206 can be carried out by means of the processing fluid. By way of example the removal can be carried out through the depression 208 and/or from the exterior 251a. The at least partial removal of the sacrificial region 206 through the depression 208 can be carried out for example by means of a centrifugal process (also referred to as spin process), i.e. while the layer stack 251 is rotated. By way of example, the sacrificial region 206 (or the sacrificial material thereof) can be etched from the outside inward and/or from the inside outward (e.g. by means of a wet bench).

In accordance with various embodiments, the sacrificial region 206 can be at least partly (i.e. partly or completely) removed in order to form a or the channel 210. At least partly removing the sacrificial region 206 may include partly or completely removing the sacrificial region 206 (or the sacrificial material thereof.) At least partly removing the sacrificial region 206 may include partly or completely removing the sacrificial region 206.

In accordance with various embodiments, the layer stack 251 (e.g. the wafer) can be dipped into the processing fluid (e.g. by means of a wet bench) in order to form a or the channel 210.

In a plurality of embodiments, a plurality of channels 210 can be formed in the sacrificial region 206.

The depression 208 can extend along a first direction 105 (also referred to as vertical direction 105, i.e. a direction transversely with respect to the lateral plane 101, 103) through the support layer 202 or at least into the latter. The or each channel 210 can extend along a second direction 101, 103 (also referred to as lateral direction 101, 103, i.e. a direction in or parallel to the lateral plane 101, 103) through the sacrificial region 206 or at least into the latter.

In order to form the or each channel 210, the processing fluid can act on the layer stack 251, e.g. on at least the sacrificial region 206. If the processing fluid acts on the useful layer 204, the processing fluid can remove the useful layer 204 (e.g. the material thereof) more slowly (e.g. not at all, or scarcely) than the sacrificial region 206 (e.g. the material thereof). In other words, the useful layer 204 can have a greater resistance than the sacrificial region 206 vis-à-vis the processing fluid. If the processing fluid acts on the support layer 202, the processing fluid can remove the support layer 202 (e.g. the material thereof) more slowly (e.g. not at all, or scarcely) than the sacrificial region 206 (e.g. the material thereof). In other words, the support layer 202 can have a greater resistance than the sacrificial region 206 vis-à-vis the processing fluid.

In accordance with various embodiments, the processing fluid may include an etching liquid, an etching gas and/or an etching plasma.

The processing fluid (e.g. the etching plasma) may include or be formed from an ionized gas. The processing fluid (e.g. the etching plasma and/or the etching gas) can be configured to react chemically with the sacrificial region 206, e.g. to form a volatile reaction product. The etching plasma can be formed by means of a plasma source, e.g. using a plasma-forming gas, such as, for example, a gas including a halide or a gas including hydrogen. The etching liquid may include or be formed from, for example, hydrofluoric acid (HF), ammonium fluoride, ammonia water, nitric acid, phosphoric acid, sulfuric acid or hydrogen peroxide. The etching gas may include or be formed from, for example, a gas including fluorine (e.g. a perfluorinated hydrocarbon or an inorganic fluorine compound) or oxygen.

The chemical composition of the processing fluid can be dependent on and adapted to the chemical composition of the layer stack 251, as described above.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method comprising:
   forming a vertical layer stack comprising a vertical outer wall exposed to an exterior of the vertical layer stack, comprising a support layer and a useful layer and a sacrificial region between them, said sacrificial region having, vis-à-vis a processing fluid, at least one of a lower mechanical or chemical resistance than the support layer and than the useful layer, wherein a main processing surface of the support layer and a main processing surface of the useful layer each extend in lateral plane perpendicular to the vertical outer wall;
   forming a depression in the support layer that extends vertically from a main surface of the support layer through the support layer so as to expose the sacrificial region; and
   forming, after the forming of the depression, at least one channel in the exposed sacrificial region by means of the processing fluid, wherein the channel connects the depression to the exterior of the layer stack, wherein the channel is a thru-hole laterally adjacent to the depression and wherein the channel extends laterally from the outer wall to the depression,
   wherein the useful layer and the support layer are at least partially in direct contact with each other, and
   wherein the depression is formed in an inner section of the support layer so that the remaining support layer forms a support ring extending along a lateral edge of the vertical layer stack,
   the method further comprising forming the useful layer by epitaxially growing the useful layer onto the support layer and the sacrificial region.

2. The method of claim 1,
   wherein the useful layer comprises at least one electrical circuit element.

3. The method of claim 1,
   wherein forming the depression comprises removing material from the support layer or comprises forming the support layer by depositing material using a mask.

4. The method of claim 1,
   wherein at least one of the useful layer and the support layer or the useful layer and the sacrificial region have an epitaxial relation to one another.

5. The method of claim 1, further comprising:
   forming the sacrificial region comprising doping at least one of the support layer or the useful layer.

6. The method of claim 1,
   wherein the sacrificial region comprises a plurality of non-contiguous segments which are at a distance from one another and each segment of which is exposed by the depression;
   wherein forming at least one channel in the sacrificial region comprises forming at least one channel in each segment of the sacrificial region.

7. The method of claim 1,
   wherein the sacrificial region has a greater porosity than at least one of the support layer or the useful layer.

8. The method of claim 1, further comprising:
   forming the sacrificial region comprising arranging a sacrificial material on the support layer.

9. The method of claim 1,
   wherein the sacrificial region differs from at least one of the support layer or the useful layer in terms of chemical composition.

10. The method of claim 1, wherein, for forming the channel, the processing fluid acts on the layer stack.

11. The method of claim 1, wherein the processing fluid comprises at least one of a group consisting of:
an etching liquid;
an etching gas; and
an etching plasma.

12. The method of claim 1, wherein the depression extends along a first direction through the support layer or at least into the latter; and
wherein the channel extends along a second direction through the sacrificial region;
wherein the second direction runs transversely with respect to the first direction.

13. The method of claim 1, wherein forming the depression is carried out before forming the at least one channel so that the formed depression exposes at least a part of the useful layer.

14. The method of claim 1, further comprising:
doping the useful layer through the depression.

15. The method of claim 14, wherein the doping through the depression forms at least one PN junction.

16. The method of claim 1, further comprising:
forming a metallization in the depression that electrically contacts the useful layer.

17. The method of claim 1, further comprising:
securing the layer stack on a carrier, before the depression is formed.

18. The method of claim 1, wherein the sacrificial region comprises an oxide material.

19. The method of claim 1, wherein a vertical extent of the channel is less than a vertical extent of the depression.

20. A method comprising:
forming a vertical layer stack comprising a vertical outer wall exposed to an exterior of the vertical layer stack, comprising a support layer and a useful layer and a sacrificial region between them, said sacrificial region having, vis-à-vis a processing fluid, at least one of a lower mechanical or chemical resistance than the support layer and than the useful layer, wherein a main processing surface of the support layer and a main processing surface of the useful layer each extend in lateral plane perpendicular to the vertical outer wall;
forming a depression in the support layer that extends vertically from a main surface of the support layer through the support layer so as to expose the sacrificial region; and
forming, after the forming of the depression, at least one channel in the exposed sacrificial region by means of the processing fluid, wherein the channel connects the depression to the exterior of the layer stack, wherein the channel is a thru-hole laterally adjacent to the depression and wherein the channel extends laterally from the outer wall to the depression,
wherein the useful layer and the support layer are at least partially in direct contact with each other, and
wherein the depression is formed in an inner section of the support layer so that the remaining support layer forms a support ring extending along a lateral edge of the vertical layer stack,
the method further comprising forming the sacrificial region comprising chemically or structurally altering at least one of the support layer or the useful layer.

21. A method comprising:
forming a vertical layer stack comprising a vertical outer wall exposed to an exterior of the vertical layer stack, comprising a support layer and a useful layer and a sacrificial region between them, said sacrificial region having, vis-à-vis a processing fluid, at least one of a lower mechanical or chemical resistance than the support layer and than the useful layer, wherein a main processing surface of the support layer and a main processing surface of the useful layer each extend in lateral plane perpendicular to the vertical outer wall;
forming a depression in the support layer that extends vertically from a main surface of the support layer through the support layer so as to expose the sacrificial region; and
forming, after the forming of the depression, at least one channel in the exposed sacrificial region by means of the processing fluid, wherein the channel connects the depression to the exterior of the layer stack, wherein the channel is a thru-hole laterally adjacent to the depression and wherein the channel extends laterally from the outer wall to the depression,
wherein the useful layer and the support layer are at least partially in direct contact with each other, and
wherein the depression is formed in an inner section of the support layer so that the remaining support layer forms a support ring extending along a lateral edge of the vertical layer stack,
the method further comprising forming the sacrificial region comprising selectively etching at least one of the support layer or the useful layer.

\* \* \* \* \*